United States Patent
Sertel

(10) Patent No.: US 11,112,454 B2
(45) Date of Patent: Sep. 7, 2021

(54) ANTENNA-COUPLED RADIO FREQUENCY (RF) PROBE WITH A REPLACEABLE TIP

(71) Applicant: Ohio State Innovation Foundation, Columbus, OH (US)

(72) Inventor: Kubilay Sertel, Hilliard, OH (US)

(73) Assignee: Ohio State Innovation Foundation, Columbus, OH (US)

(*) Notice: Subject to any disclaimer, the term of this patent is extended or adjusted under 35 U.S.C. 154(b) by 274 days.

(21) Appl. No.: 16/461,208

(22) PCT Filed: Nov. 15, 2017

(86) PCT No.: PCT/US2017/061744
§ 371 (c)(1),
(2) Date: May 15, 2019

(87) PCT Pub. No.: WO2018/093858
PCT Pub. Date: May 24, 2018

(65) Prior Publication Data
US 2019/0310315 A1  Oct. 10, 2019

Related U.S. Application Data

(60) Provisional application No. 62/422,220, filed on Nov. 15, 2016.

(51) Int. Cl.
*G01R 31/302* (2006.01)
*G01R 1/067* (2006.01)
*H01Q 19/06* (2006.01)

(52) U.S. Cl.
CPC ..... *G01R 31/3025* (2013.01); *G01R 1/06772* (2013.01); *H01Q 19/062* (2013.01); *H01Q 19/06* (2013.01)

(58) Field of Classification Search
CPC .......... G01R 31/2656; G01R 31/2822; G01R 31/3025; G01R 31/311
See application file for complete search history.

(56) References Cited

U.S. PATENT DOCUMENTS 5,969,341 A  10/1999  Ito et al.
6,236,880 B1*  5/2001  Raylman ............. A61B 6/4057
                                                600/436

(Continued)

OTHER PUBLICATIONS

International Search Report and Written Opinion, issued by the International Searching Authority (US) in PCT Application No. PCT/US2017/061744 dated Jan. 23, 2018. 10 pages.

(Continued)

*Primary Examiner* — Tung X Nguyen
(74) *Attorney, Agent, or Firm* — Meunier Carlin & Curfman LLC

(57) ABSTRACT

Described herein are antenna-coupled radio frequency (RF) probes with replaceable tips. In the described embodiments, test signals are coupled onto a probe tip wafer via an on-tip antenna, thus the probe tip is decoupled from the probe body. This allows for separate fabrication of the probe body and the probe tip. As such, the probe tip can be made available as a "commodity" and the user can simply replace a worn-out or damaged probe tip, providing significant savings in per-unit cost and operation cost of the new contact probes. The decoupling of probe tip and probe body allows for manual replacement of probe tip without the need for extremely accurate alignment which is typically required in extremely high frequency probes. Manual replacement of the tips is only possible due to the much less stringent alignment requirements afforded by the antenna coupling from the probe body to the probe tip.

29 Claims, 24 Drawing Sheets

(56) References Cited

U.S. PATENT DOCUMENTS

| | | | |
|---|---|---|---|
| 7,109,928 B1* | 9/2006 | Thiele | H01Q 1/38 |
| | | | 343/700 MS |
| 2002/0036491 A1* | 3/2002 | Whitaker | G01R 29/14 |
| | | | 324/96 |
| 2008/0052028 A1* | 2/2008 | Pickerd | G01R 35/005 |
| | | | 702/109 |
| 2008/0290856 A1 | 11/2008 | Hoffmann et al. | |
| 2010/0301217 A1 | 12/2010 | Sertel et al. | |
| 2011/0032253 A1 | 2/2011 | Zaman et al. | |
| 2013/0106456 A1 | 5/2013 | Weikle, II et al. | |
| 2015/0102225 A1 | 4/2015 | Sertel et al. | |
| 2015/0192467 A1* | 7/2015 | Sharma | G01J 3/453 |
| | | | 250/339.07 |

OTHER PUBLICATIONS

Caglayan, Cosan, and Kubilay Sertel. "Non-contact differential-mode on-wafer device characterization in the mmW and THz bands." 2016 IEEE MTT-S International Microwave Symposium (IMS). IEEE, Aug. 11, 2016.

Extended European Search Report issued by the European Patent Office in Application No. EP 17871748.4 dated May 11, 2020. 10 pages.

* cited by examiner

ON-CHIP ANTENNA ARRAYS SINGLE-MODE
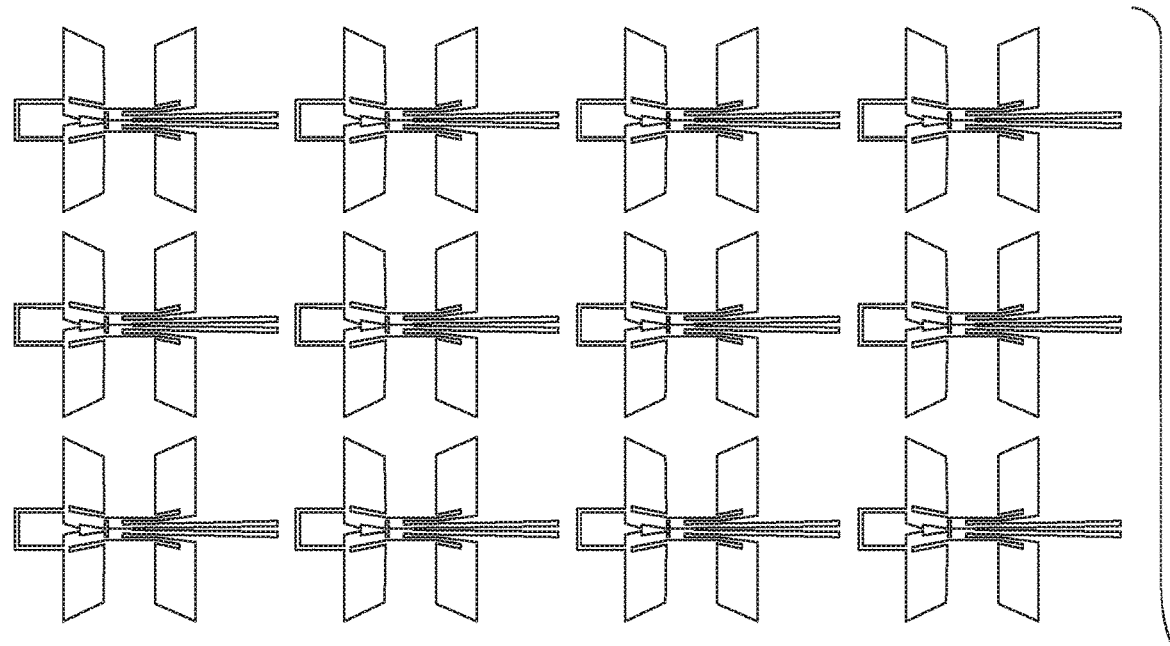
ON-CHIP ANTENNA ARRAYS DIFFERENTIAL MODE
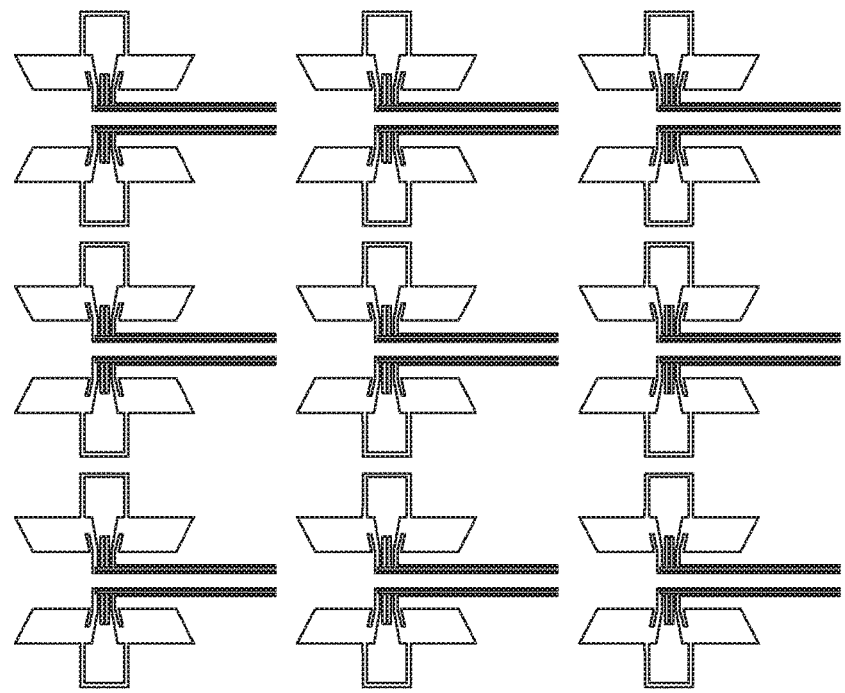
FIG. 7

ANTENNA-COUPLED RADIO FREQUENCY (RF) PROBE WITH A REPLACEABLE TIP

CROSS REFERENCE TO RELATED APPLICATION

This application is a national stage application filed under 35 U.S.C. § 371 of PCT/US2017/061744 filed Nov. 15, 2017, which claims priority to and benefit of U.S. Provisional Patent Application No. 62/422,220 filed Nov. 15, 2016, both of which are fully incorporated by reference and made a part hereof.

GOVERNMENT SUPPORT CLAUSE

This invention was made with government support under grant number 201836 awarded by the Office of Naval Research. The government has certain rights to this invention.

BACKGROUND

RF probes are typically used for on-chip characterization of semiconductor devices and integrated circuits (ICs) for frequencies ranging from DC to 10s of GHz. For frequencies beyond 100 GHz, waveguide based frequency extenders are used in conjunction with conventional measurement instrumentation, such as vector network analyzers (VNAs), spectrum analyzers, and other tools. Due to the standard rectangular waveguide topology, the measurement bandwidths of these probes are often limited to the fundamental waveguide mode frequencies. The probe tip is often in the form of a 3-conductor ground-signal-ground (GSG) metallization and is carefully transitioned to the waveguide flange to minimize insertion losses. The probe requires a physical contact with the chip under test. The probe tips are typically fabricated in form of thin silicon chips (see, for example, Dominion MicroProbes Inc.), thin-film microstip lines (see, for example, Cascade Microtech Inc.), or micro-coaxial transmission lines (see, for example, GGB Industries) that require micromachining or microfabrication. Also, the probe tips are affixed to the probe body via mechanical clamping. As such, they are susceptible to vibrations in the measurement setup and flex under stress during contact. In addition, the sharp tips are often used to break through the thin passivation layers on the wafer to make electrical contact with the pads. This process puts undue physical stress on the probe tips, further limiting the lifetime of contact probes. More importantly for terahertz (THz)-frequency probes, unless the contact force between the probe tip and test chip is kept under a threshold value, tip metallizations typically wear off, resulting in detrimental mismatches. At this point the damaged probe tips need to be replaced by the vendor to restore performance.

Moreover, contact probes used for on-wafer device and integrated circuit testing at extremely high frequencies (millimeter-wave and terahertz bands) are extremely costly due to high precision micromachining and they are very fragile due to their physical size and the physical contact that they make with the test wafer many hundreds of times. Conventionally available probes have fixed probe tips and are prone to wear and tear due to normal use. When the tips get damaged over time, the manufacturer must service the tips, which is another costly and time-consuming process, typically taking many weeks to months while the user must wait and may not be able to continue working.

Under ideal conditions, contact probes can be very effective and exhibit long life cycles. For instance, DMPI Inc. rates their probes to 10s of thousands of contact cycles. However, this rating is for a controlled setup where the contact force is precisely kept below a certain threshold. In practice, a human operator can easily exceed the threshold for the contact force and damage the probe tip.

Furthermore, single-mode GSG contact probes are only currently scalable up to 1.1 THz, whereas dual-tip GSGSG contact probes (for differential device and IC characterization) are only currently available up to 140 GHz. In addition, the insertion loss of the currently available contact probes grows with increasing frequency, limiting the dynamic range and scalability for higher frequencies. Furthermore, a separate probe for each waveguide band is needed, further exacerbating the cost of the available wafer probing solutions.

Therefore, a contact probe is descried that overcomes challenges in the art, some of which are described above.

SUMMARY

Described and disclosed herein are antenna-coupled RF probes with replaceable tips. In the described embodiments, test signals are coupled onto a probe tip wafer via an on-chip antenna, as such, the probe tip is decoupled from the probe body. This allows for separate fabrication of the probe body and the probe tip. Doing so, the probe tip can be made available as a "commodity" and the user can simply replace a worn-out or damaged probe tip, providing significant savings in per-unit cost and operation cost of the new contact probes. The decoupling of probe tip and probe body allows for manual replacement of probe tip without the need for extremely accurate alignment which is typically required in extremely high frequency probes. Manual replacement of the tips is only possible due to the much less stringent alignment requirements afforded by the antenna coupling from the probe body to the probe tip.

Other devices, systems, methods, features and/or advantages will be or may become apparent to one with skill in the art upon examination of the following drawings and detailed description. It is intended that all such additional systems, methods, features and/or advantages be included within this description and be protected by the accompanying claims.

BRIEF DESCRIPTION OF THE DRAWINGS

The following detailed description will be better understood when read in conjunction with the appended drawings, in which there is shown one or more of the multiple embodiments of the present disclosure. It should be understood, however, that the various embodiments of the present disclosure are not limited to the precise arrangements and instrumentalities shown in the drawings.

FIG. 7 illustrates non-limiting examples of antenna arrays that may comprise the one or more antennas that receive the signals from the probe tip via the transmission lines.

DETAILED DESCRIPTION

Figure 1:
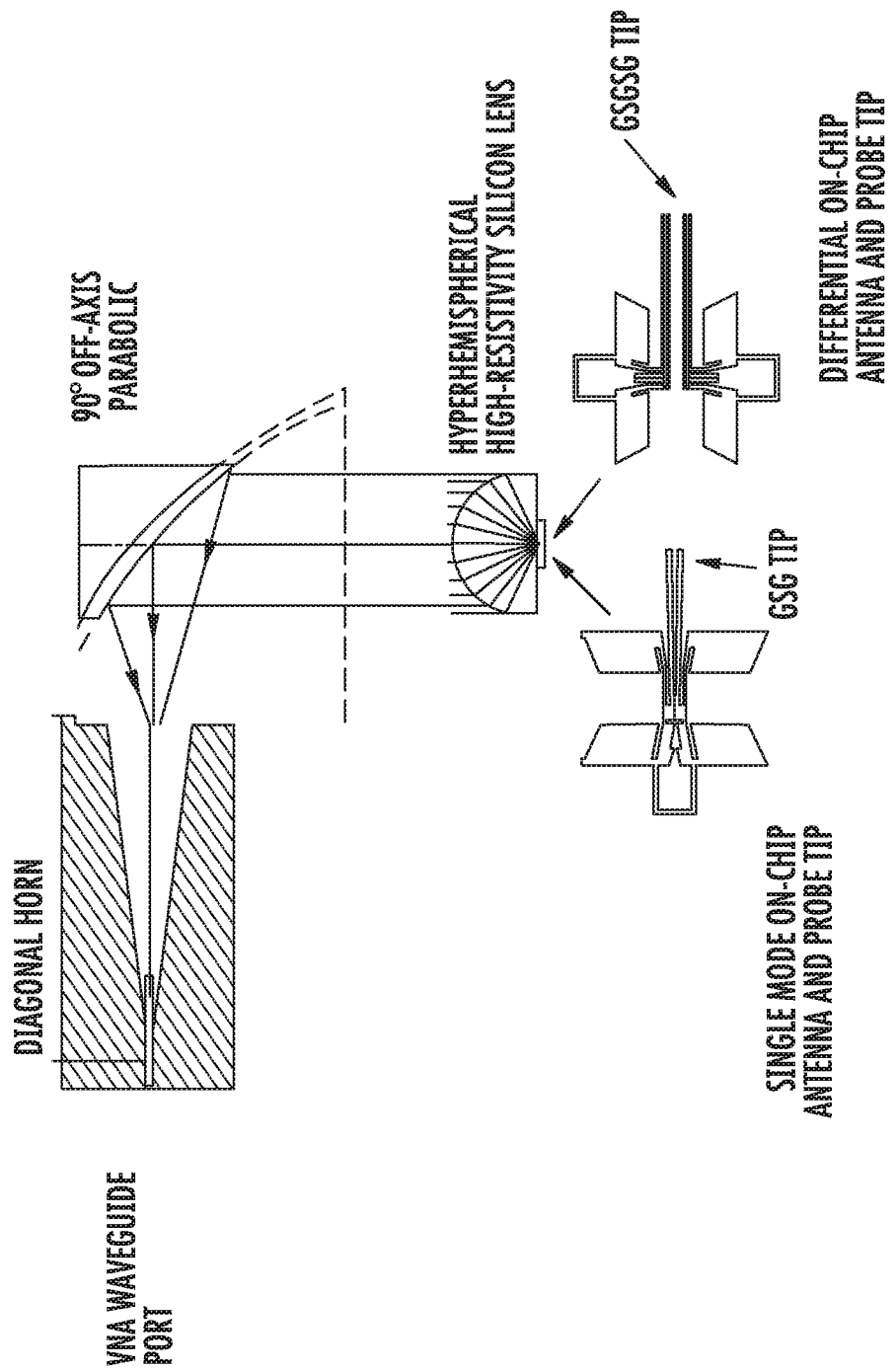
FIGS. 1-6 are illustrations of non-limiting embodiments of an antenna-coupled radio frequency (RF) probe with a replaceable tip.

Before the present methods and systems are disclosed and described, it is to be understood that the methods and systems are not limited to specific synthetic methods, specific components, or to particular compositions. It is also to be understood that the terminology used herein is for the purpose of describing particular embodiments only and is not intended to be limiting.

As used in the specification and the appended claims, the singular forms "a," "an" and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other additives, components, integers or steps. "Exemplary" means "an example of" and is not intended to convey an indication of a preferred or ideal embodiment. "Such as" is not used in a restrictive sense, but for explanatory purposes.

Disclosed are components that can be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific embodiment or combination of embodiments of the disclosed methods.

The present methods and systems may be understood more readily by reference to the following detailed description of preferred embodiments and the Examples included therein and to the Figures and their previous and following description.

Disclosed and described herein are embodiments of antenna-coupled RF probes with replaceable tips. Generally, the embodiments comprise a coupling port (typically in form of a waveguide), a directive antenna or a guiding structure (attached to the probe waveguide), a reflector (parabolic) collimating the directive antenna radiation, a lens at one end of the collimated beam, an antenna wafer, one or more antennas located on the antenna wafer, one or more transmission lines on the antenna wafer that transmit signals between the one or more antennas to a probe tip.

FIG. 1 is an illustration of one of the embodiments of an antenna-coupled radio frequency (RF) probe with a replaceable tip. This embodiment comprises a quasi-optical system to couple waveguide output of the measurement instrument to on-chip coplanar waveguide ports. Signals from a device under testing (DUT) are received at the probe tip. The tip may be, for example, a ground-signal (GS), a ground-signal-ground (GSG), or a GSGSG tip, as are known to one of ordinary skill in the art. One or more transmission lines transmit the signal received by the probe tip to one or more antennas. The signals may comprise a differential signal or a single-mode signal. Separate from the one or more antennas is a lens, a collimating structure, and a directive antenna at the end of a waveguide, which comprise a probe body. The one or more antennas transmit the received signal(s) from the probe tip into the lens and toward the collimating structure. The collumator focuses the received wave signals such that they are routed to a desired location. For example, the one or more collimating structure may route the wave signals through a directive antenna into the probe waveguide of a vector network analyzer (VNA) horn. Because the one or more antennas on the probe tip wafer are separate from the probe body, the probe tip is decoupled from the probe body, making tip replacement fast and easy. Further, the fabrication process is enhanced as the probe body and the probe tip can be manufactured separately. Furthermore, the probe body can be used for a wide range of frequencies; therefore, the probe tip can be matched to the desired frequency and thus not requiring a complete RF probe assembly for each desired frequency. And, as the insertion loss of the probe body of the probe system is frequency-independent, this allows for scaling into the terahertz (THz) frequency band of both single-mode and differential-mode probe measurements. Furthermore, in some embodiments, DC bias pads of the probe antenna allow for direct current injection bias to be applied to the device under test. The DC current injection can be transferred from the main probe body to the replaceable probe tip via clamping and/or pin connection.

Figure 2:
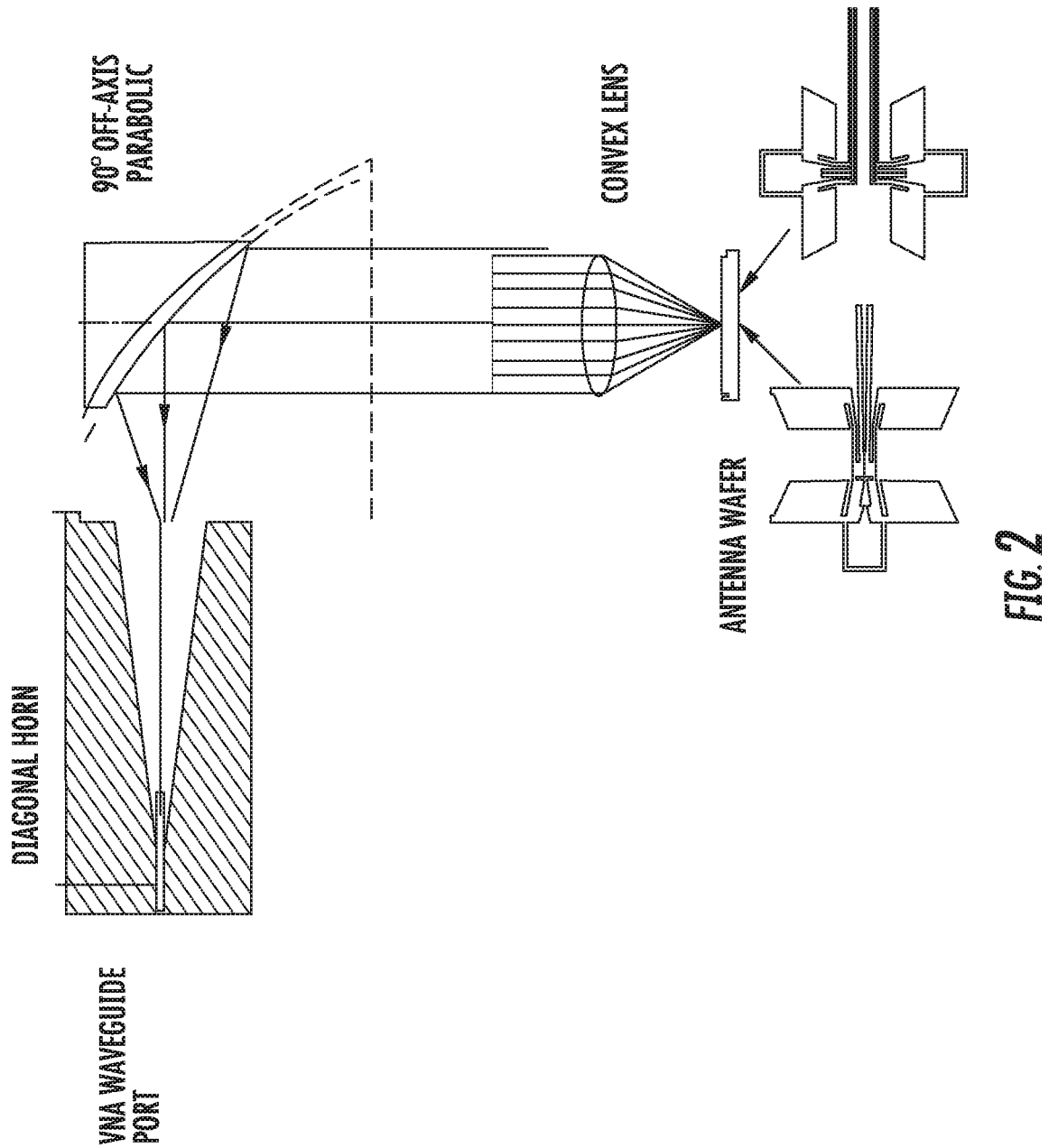

FIG. 2 is an illustration of one of the embodiments of an antenna-coupled radio frequency (RF) probe with a replaceable tip. In this embodiment, the lens of the probe body comprises a convex lens. This embodiment also comprises an antenna wafer. The probe tip is located on the antenna wafer. One or more transmission lines transmit the signal received by the probe tip to one or more antennas that are located on the antenna wafer. The signals may comprise a differential signal or a single-mode signal. Separate from the antenna wafer is the probe body. The one or more antennas located on the antenna wafer transmit the received signal(s) to the convex lens. The convex lens focuses the received wave signals such that they are routed to a desired location using a collimating structure. In some instances, the collimating structure may comprise one or more mirrors such as the $90°$ off-axis parabolic mirror shown in FIG. 2. For example, the one or more mirrors may route the wave signals to the VNA horn. Because the antenna wafer is separate from the waveguide/lens body, the probe tip is decoupled from the probe body, making tip replacement fast and easy. Further, the fabrication process is enhanced as the probe body and the probe type/antenna wafer can be manufactured separately. Furthermore, the probe body can be used for a wide range of frequencies; therefore, the probe tip can be matched to the desired frequency and thus not requiring a complete RF probe assembly for each desired frequency. And, as the insertion loss of the probe body of the probe system is frequency-independent, this allows for scaling into the THz frequency band of both single-mode and differential-mode probe measurements. Furthermore, in some embodiments, DC bias pads of the probe antenna allow for direct current injection bias to be applied to the device under test. The DC current injection can be transferred from the main probe body to the replaceable probe tip via clamping and/or pin connection.

Figure 3:
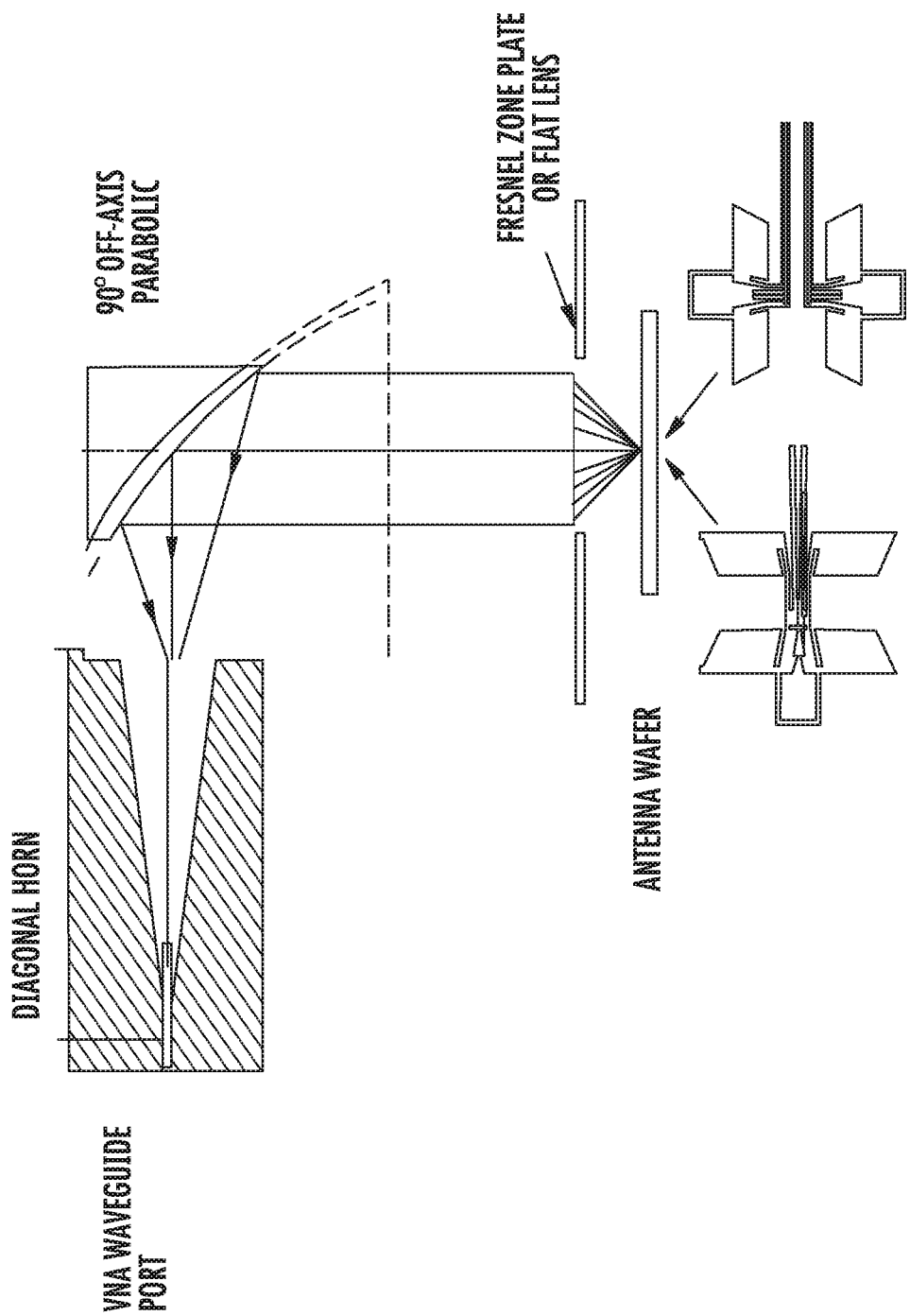

FIG. 3 is an illustration of yet another embodiment of an antenna-coupled radio frequency (RF) probe with a replaceable tip. In this embodiment, the lens of the probe body comprises a Fresnel zone plate or a flat lens. This embodiment also comprises an antenna wafer. The probe tip is located on the antenna wafer. As with the embodiments of FIGS. 1 and 2, one or more transmission lines transmit the signal received by the probe tip to one or more antennas that are located on the antenna wafer. The signals may comprise a differential signal or a single-mode signal. Separate from the antenna wafer is the probe body. The one or more antennas located on the antenna wafer transmit the received signal(s) to the Fresnel zone plate or a flat lens. The Fresnel zone plate or a flat lens focuses the received wave signals such that they are routed to a desired location using a collimating structure. In some instances, the collimating structure may comprise one or more mirrors such as the $90°$ off-axis parabolic mirror shown in FIG. 3. The one or more mirrors are used to route the received wave signals to a desired location. For example, the one or more mirrors may route the wave signals to the VNA horn. Because the antenna wafer is separate from the waveguide/lens body, the probe tip is decoupled from the probe body, making tip replacement fast and easy. Further, the fabrication process is enhanced as the probe body and the probe type/antenna wafer can be manufactured separately. Furthermore, the probe body can be used for a wide range of frequencies; therefore, the probe tip can be matched to the desired frequency and thus not requiring a complete RF probe assembly for each desired frequency. And, as the insertion loss of the probe body of the probe system is frequency-independent, this allows for scaling into the THz frequency band of both single-mode and differential-mode probe measurements. Furthermore, in some embodiments, DC bias pads of the probe antenna allow for direct current injection bias to be applied to the device under test. The DC current injection can be transferred from the main probe body to the replaceable probe tip via clamping and/or pin connection.

Figure 4:
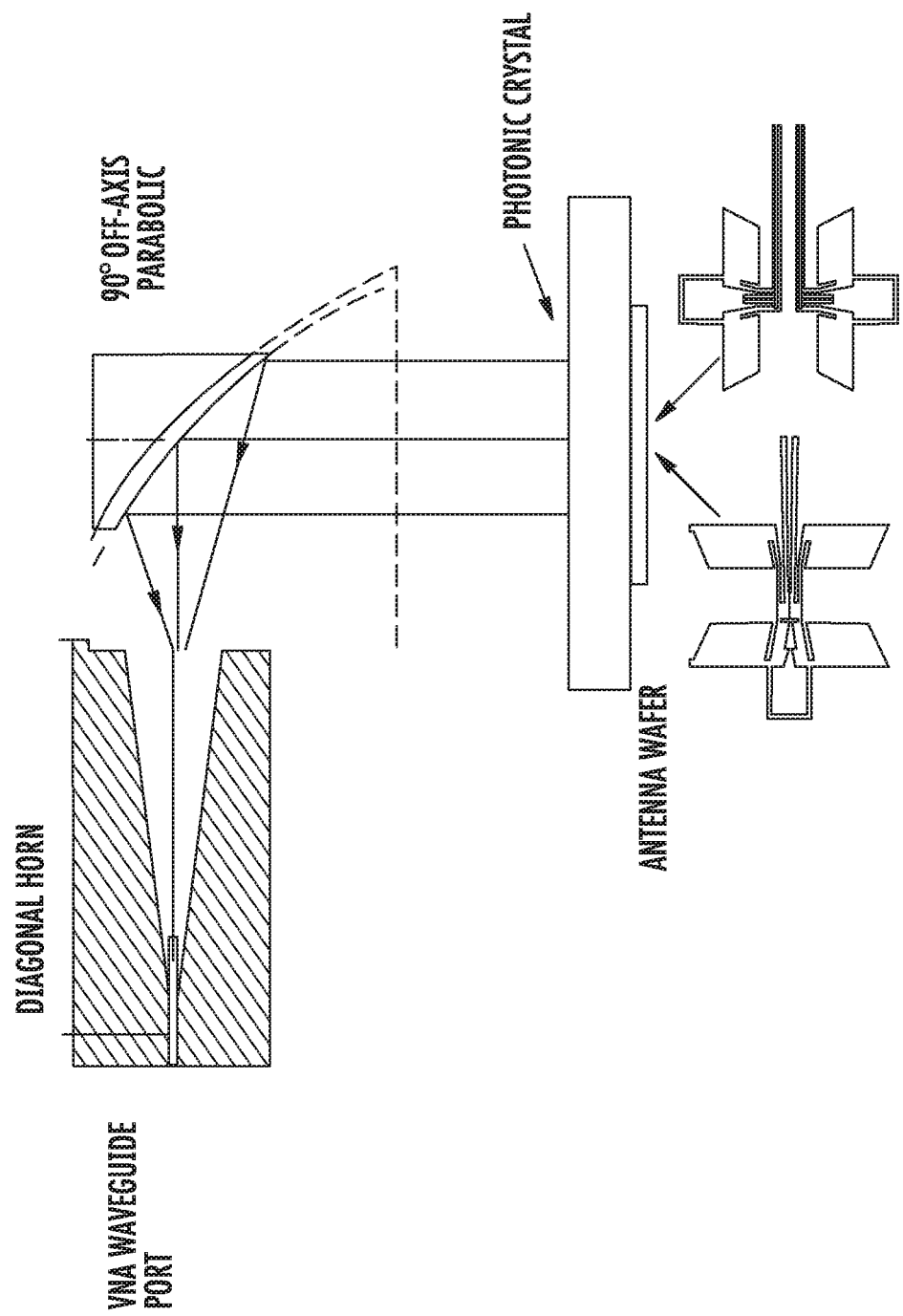

FIG. 4 is an illustration of yet another embodiment of an antenna-coupled radio frequency (RF) probe with a replaceable tip. In this embodiment, the lens of the probe body has been replaced with a photonic crystal, as known to one of ordinary skill in the art. This embodiment also comprises an antenna wafer. The probe tip is located on the antenna wafer. As with the embodiments of FIGS. 1, 2, and 3, one or more transmission lines transmit the signal received by the probe tip to one or more antennas that are located on the antenna wafer. The signals may comprise a differential signal or a single-mode signal. Separate from the antenna wafer is the probe body. The one or more antennas located on the antenna wafer transmit the received signal(s) to the photonic crystal. The photonic crystal causes the received wave signals to be routed through the waveguide. In some instances, the system may further comprise one or more collimating reflectors such as the $90°$ off-axis parabolic mirror shown in FIG. 4. The one or more collimating reflectors are used to route the received wave signals to a desired location. For example, the one or more collimating reflectors may route the wave signals to a directive antenna into a probe waveguide. Because the antenna wafer is separate from the waveguide/lens body, the probe tip is decoupled from the probe body, making tip replacement fast and easy. Further, the fabrication process is enhanced as the probe body and the probe type/antenna wafer can be manufactured separately. Furthermore, the probe body can be used for a wide range of frequencies; therefore, the probe tip can be matched to the desired frequency and thus not requiring a complete RF probe assembly for each desired frequency. And, as the insertion loss of the probe body of the probe system is frequency-independent, this allows for scaling into the THz frequency band of both single-mode and differential-mode probe measurements. Furthermore, in some embodiments, DC bias pads of the probe antenna allow for direct current injection bias to be applied to the device under test. The DC current injection can be transferred from the main probe body to the replaceable probe tip via clamping and/or pin connection.

Figure 5:
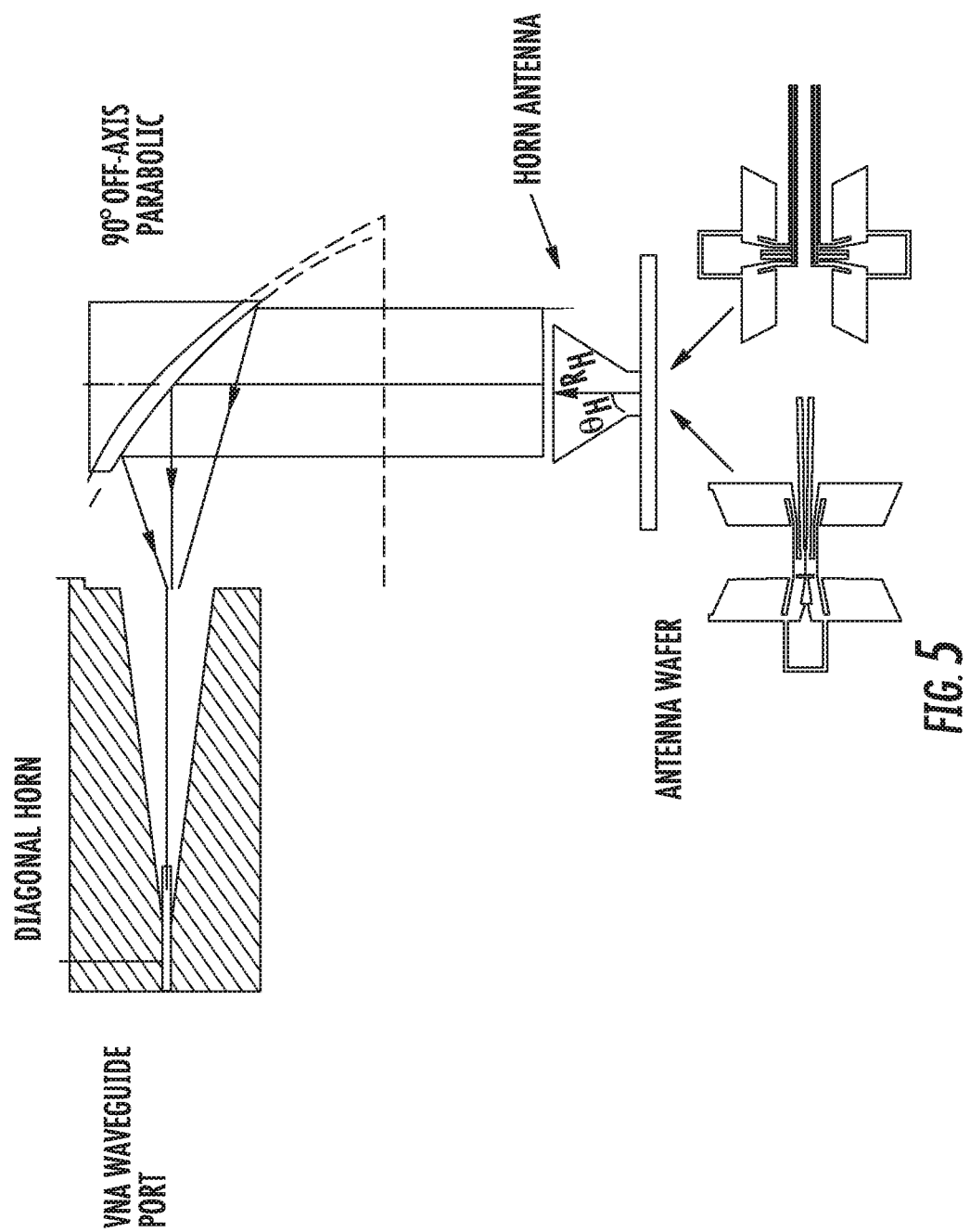

FIG. 5 is an illustration of yet another embodiment of an antenna-coupled radio frequency (RF) probe with a replaceable tip. In this embodiment, the probe body includes a horn antenna to focus the signal onto the probe tip antenna, as known to one of ordinary skill in the art. This embodiment also comprises an antenna wafer. The probe tip is located on the antenna wafer. As with the embodiments of FIGS. 1, 2, 3 and 4, one or more transmission lines transmit the signal received by the probe tip to one or more antennas that are located on the antenna wafer. The signals may comprise a differential signal or a single-mode signal. Separate from the antenna wafer is the probe body. The one or more antennas located on the antenna wafer transmit the received signal(s) to the horn antenna. The horn antenna causes the received wave signals to be routed through the waveguide. In some instances, the system may further comprise one or more collimating reflectors such as the 90° off-axis parabolic mirror shown in FIG. 5. The one or more collimating reflectors are used to route the received wave signals to a desired location. For example, the one or more collimating reflectors may route the wave signals to the VNA horn. Because the antenna wafer is separate from the waveguide/lens body, the probe tip is decoupled from the probe body, making tip replacement fast and easy. Further, the fabrication process is enhanced as the probe body and the probe type/antenna wafer can be manufactured separately. Furthermore, the probe body can be used for a wide range of frequencies; therefore, the probe tip can be matched to the desired frequency and thus not requiring a complete RF probe assembly for each desired frequency. And, as the insertion loss of the probe body of the probe system is frequency-independent, this allows for scaling into the THz frequency band of both single-mode and differential-mode probe measurements. Furthermore, in some embodiments, DC bias pads of the probe antenna allow for direct current injection bias to be applied to the device under test. The DC current injection can be transferred from the main probe body to the replaceable probe tip via clamping and/or pin connection.

Figure 6:
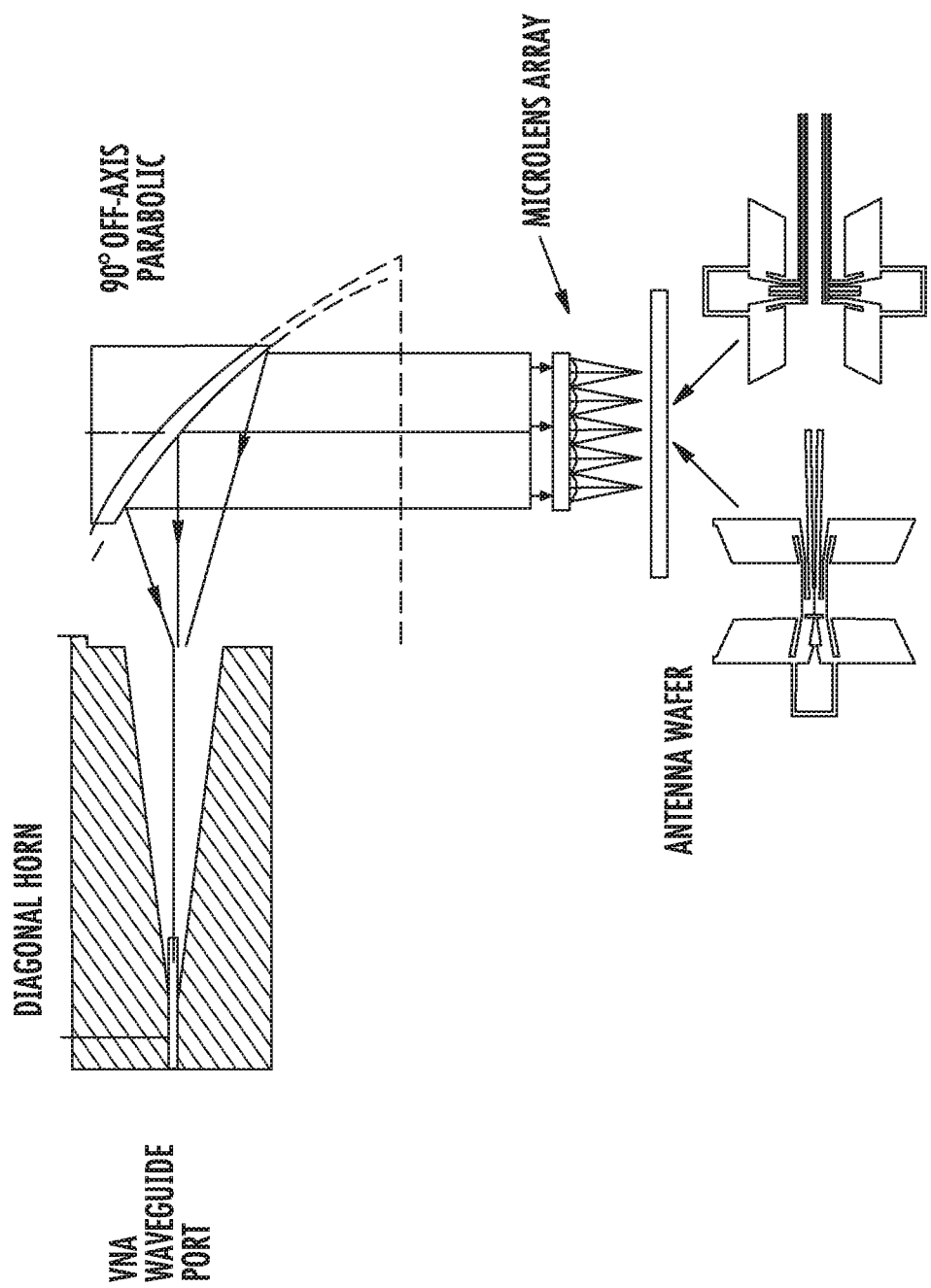

FIG. 6 is an illustration of yet another embodiment of an antenna-coupled radio frequency (RF) probe with a replaceable tip. In this embodiment, the probe body includes a micro-lens array, as known to one of ordinary skill in the art. This embodiment also comprises an antenna wafer. The probe tip is located on the antenna wafer. As with the embodiments of FIGS. 1, 2, 3, 4 and 5, one or more transmission lines transmit the signal received by the probe tip to one or more antennas that are located on the antenna wafer. The signals may comprise a differential signal or a single-mode signal. Separate from the antenna wafer is the probe body. The one or more antennas located on the antenna wafer transmit the received signal(s) to the micro-lens array. The micro-lens array causes the received wave signals to be routed through the waveguide. In some instances, the system may further comprise one or more collimating reflectors such as the 90° off-axis parabolic mirror shown in FIG. 6. The one or more collimating reflectors are used to route the received wave signals to a desired location. For example, the one or more collimating reflectors may route the wave signals to the VNA horn. Because the antenna wafer is separate from the waveguide/lens body, the probe tip is decoupled from the probe body, making tip replacement fast and easy. Further, the fabrication process is enhanced as the probe body and the probe type/antenna wafer can be manufactured separately. Furthermore, the probe body can be used for a wide range of frequencies; therefore, the probe tip can be matched to the desired frequency and thus not requiring a complete RF probe assembly for each desired frequency. And, as the insertion loss of the probe body of the probe system is frequency-independent, this allows for scaling into the THz frequency band of both single-mode and differential-mode probe measurements. Furthermore, in some embodiments, DC bias pads of the probe antenna allow for direct current injection bias to be applied to the device under test. The DC current injection can be transferred from the main probe body to the replaceable probe tip via clamping and/or pin connection.

FIG. 7 are embodiments of antenna arrays that may comprise the one or more antennas that receive the signals from the probe tip via the transmission lines. The signals may comprise a differential signal or a single-mode signal. The number and arrangement of the antennas used in the antenna arrays may vary. The antenna arrays may be located on an antenna wafer, separate from the probe body.

Figure 8:
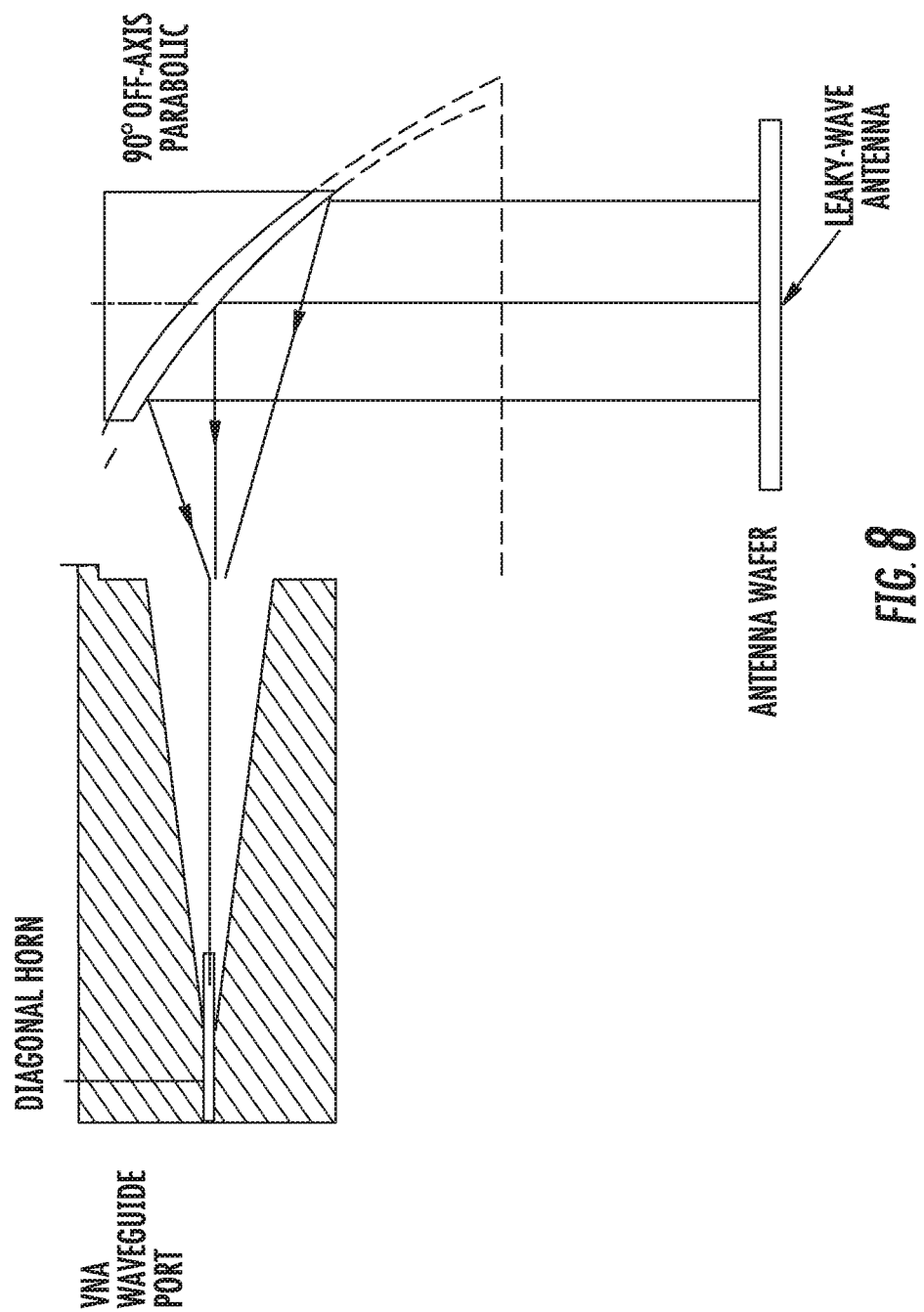
FIG. 8 is an illustration of another non-limiting embodiment of an antenna-coupled radio frequency (RF) probe with a replaceable tip. In this embodiment, a leaky-wave antenna or antenna array is used to couple probe signals onto the replaceable probe tip.

FIG. 8 is an illustration of yet another embodiment of an antenna-coupled radio frequency (RF) probe with a replaceable tip. In this embodiment, the probe body includes a leaky wave antenna or array, as known to one of ordinary skill in the art. This embodiment also comprises an antenna wafer. The probe tip is located on the antenna wafer. As with the embodiments of FIGS. 1, 2, 3, 4 and 5, 6, 7 one or more transmission lines transmit the signal received by the probe tip to one or more antennas that are located on the antenna wafer. The signals may comprise a differential signal or a single-mode signal. Separate from the antenna wafer is the probe body. The one or more antennas located on the antenna wafer transmit the received signal(s) to the leaky-wave antennas or array. The leaky-wave antennas or array causes the received wave signals to be routed through the waveguide. In some instances, the system may further comprise one or more mirrors such as the 90° off-axis parabolic mirror shown in FIG. 6. The one or more mirrors are used to route the received wave signals to a desired location. For example, the one or more mirrors may route the wave signals to the VNA horn. Because the antenna wafer is separate from the waveguide/lens body, the probe tip is decoupled from the probe body, making tip replacement fast and easy. Further, the fabrication process is enhanced as the probe body and the probe type/antenna wafer can be manufactured separately. Furthermore, the probe body can be used for a wide range of frequencies, therefore, the probe tip can be matched to the desired frequency and thus not requiring a complete RF probe assembly for each desired frequency. And, as the insertion loss of the probe body of the probe system is frequency-independent, this allows for scaling into the THz frequency band of both single-mode and differential-mode probe measurements. Furthermore, in some embodiments, DC bias pads of the probe antenna allow for direct current injection bias to be applied to the device under test. The DC current injection can be transferred from the main probe body to the replaceable probe tip via clamping and/or pin connection.

Figure 9:
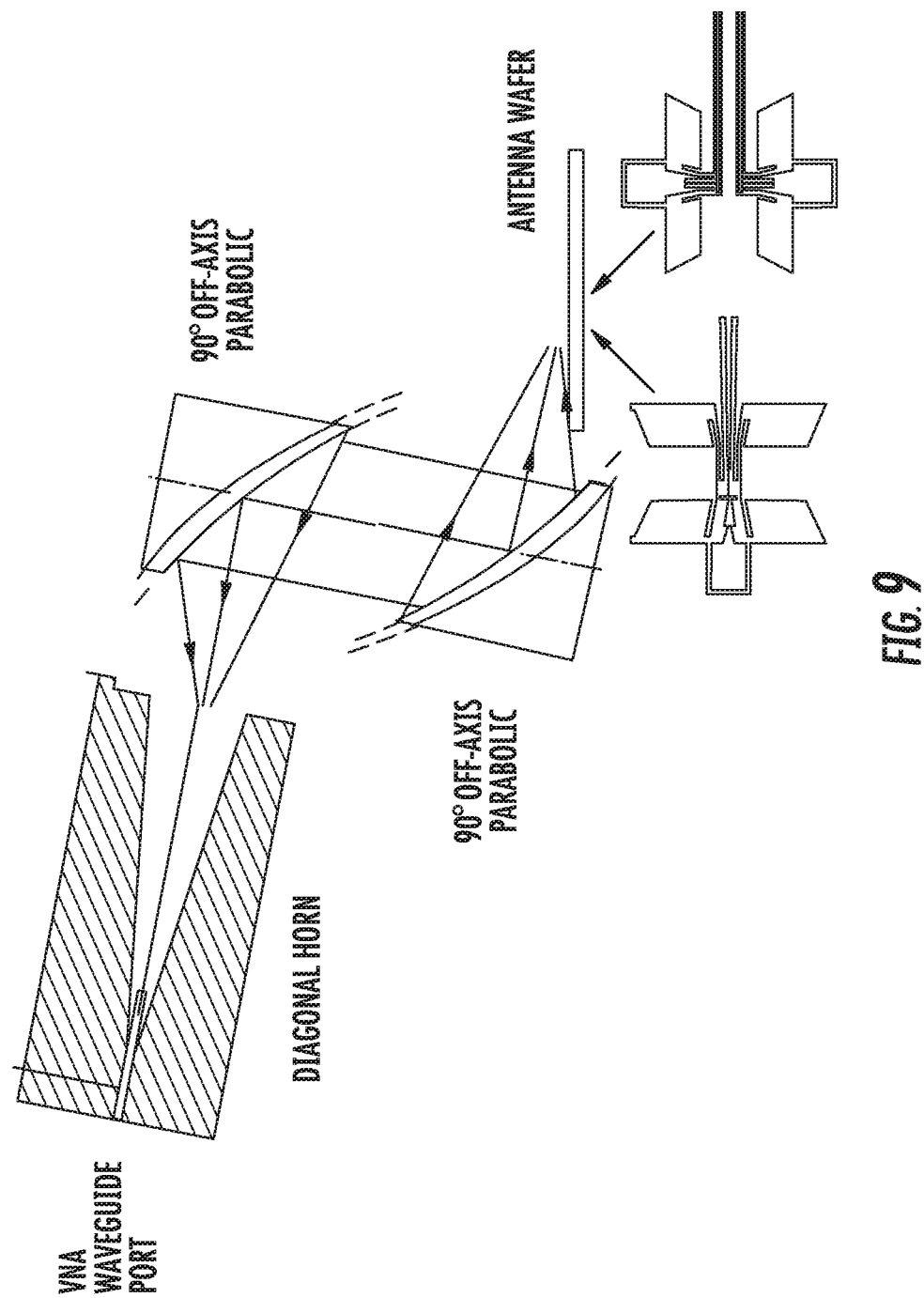
FIG. 9 is an illustration of yet another embodiment of an antenna-coupled radio frequency (RF) probe with a replaceable tip. In this embodiment, the probe body includes a plurality of mirrors, as opposed to a single mirror and a single lens, such that signals from the antenna on the antenna wafer are directed to a desired location such as the waveguide port.

FIG. 9 is an illustration of yet another embodiment of an antenna-coupled radio frequency (RF) probe with a replaceable tip. In this embodiment, the probe body includes a plurality of collimating reflectors such that signals from the antenna on the antenna wafer are directed to a desired location such as the VNA waveguide port.

Figure 10:
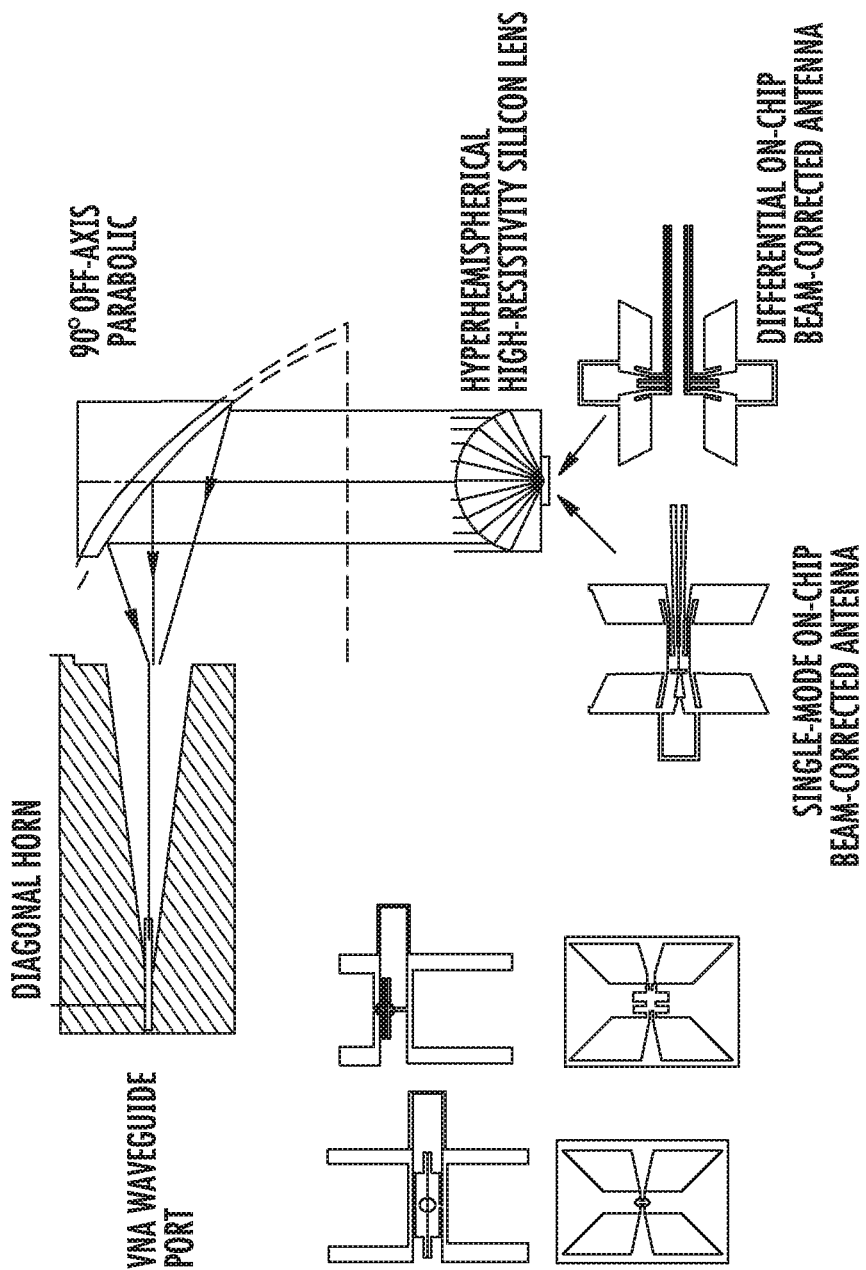
FIG. 10 is an illustration of an embodiment of an antenna-coupled radio frequency (RF) probe with a replaceable tip that uses beam-corrected antenna that can be placed closer to the edge of the lens and away from the optical axis of the lens.
Figure 11:
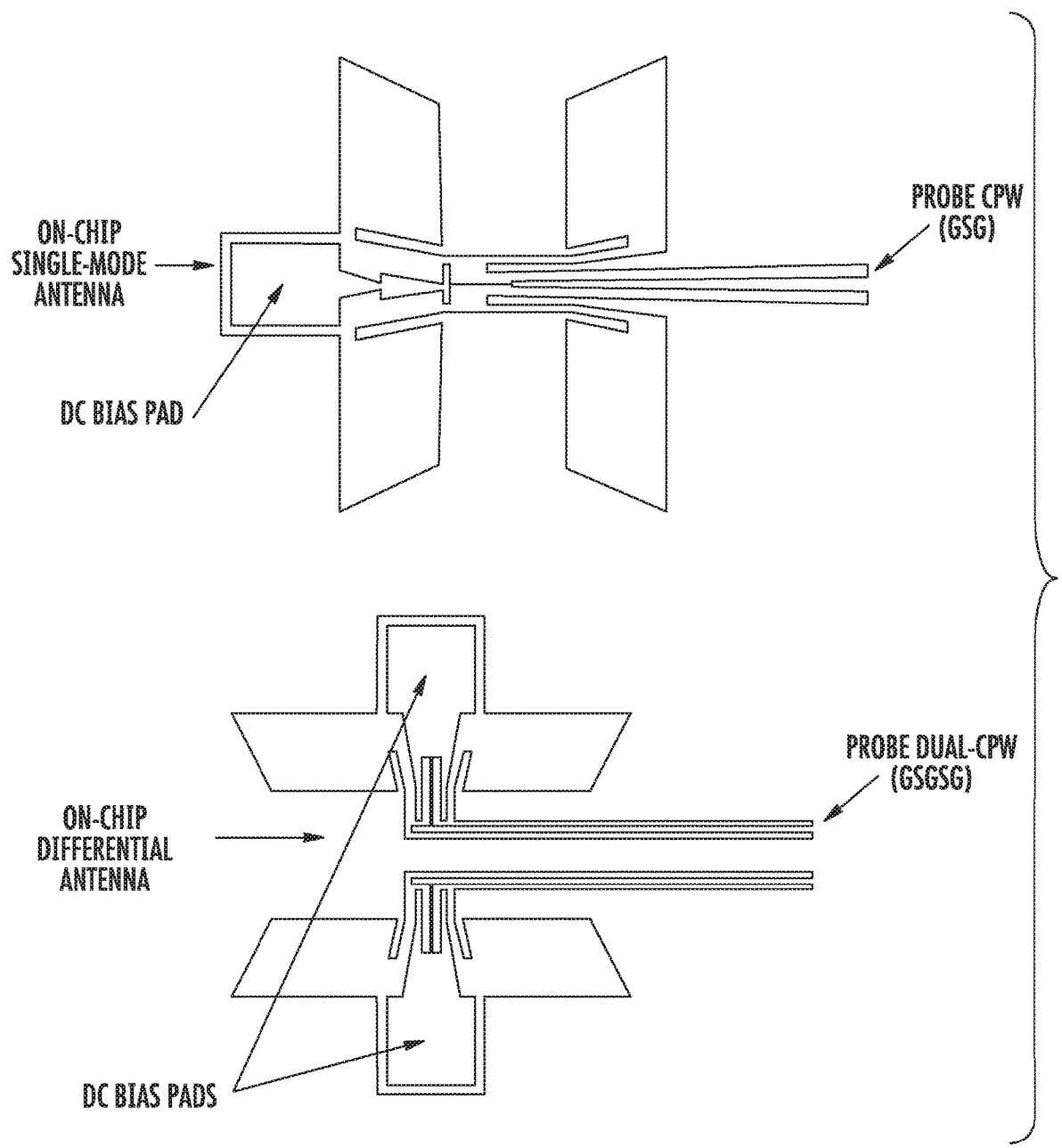
FIG. 11 illustrates that at least one of the one or more antenna may also comprise DC bias pads.
Figure 12:
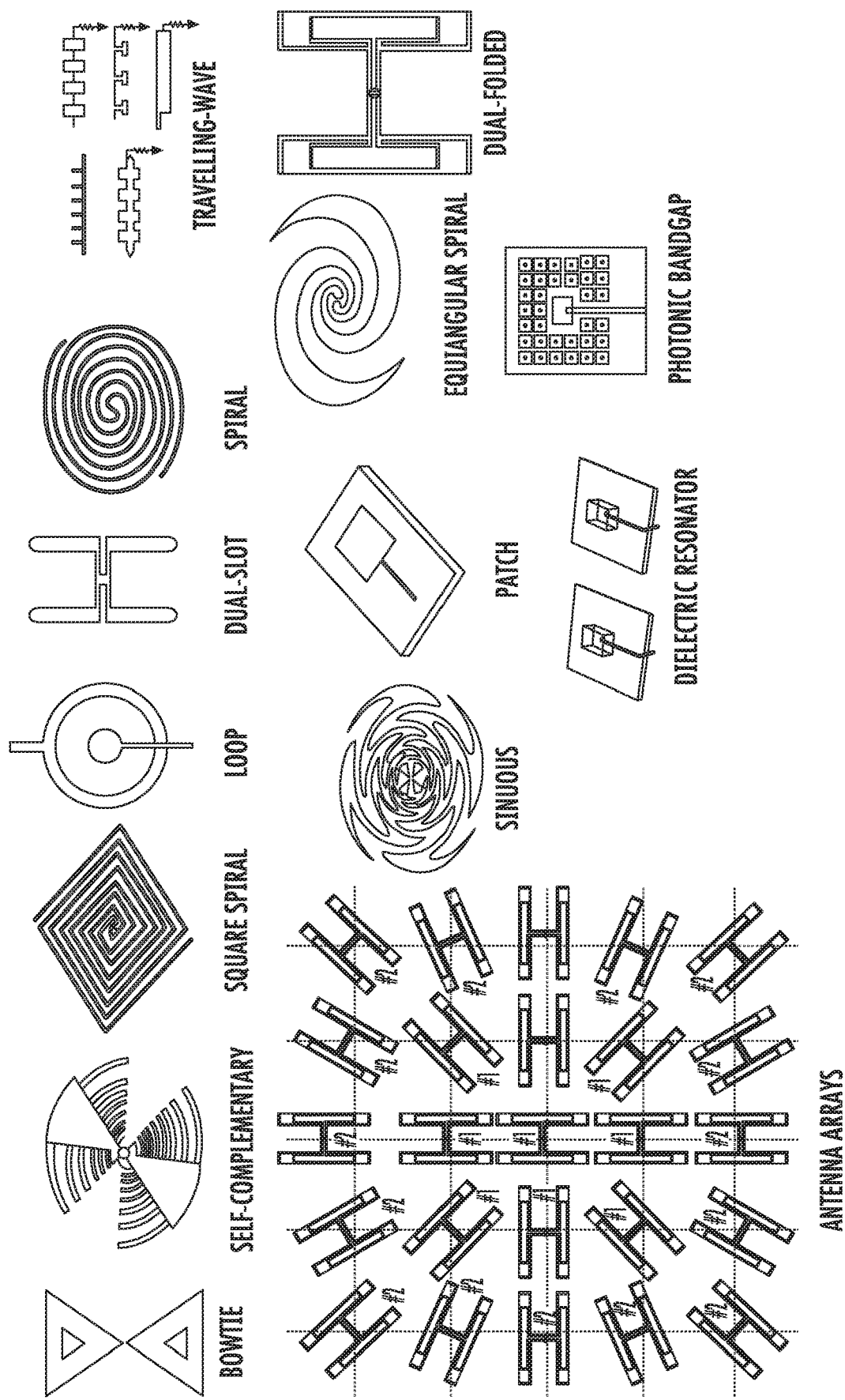
FIG. 12 illustrates several non-limiting examples of antennas that can be used in embodiments of the antenna-coupled radio frequency (RF) probe with a replaceable tip described herein.

FIG. 10 is an illustration of an embodiment of an antenna-coupled radio frequency (RF) probe with a replaceable tip that uses beam-corrected antenna located away from the optical axis of the quasi-optical link, and closer to the edge of the lens. The beam-corrected antenna may be single-mode or differential mode. The beam-corrected antenna may be located separately from the probe boy on an antenna wafer. On the bottom, left side of FIG. 10 are various non-limiting examples of beam-corrected antenna that may be used. FIG. 11 illustrates that at least one of the one or more antenna may also comprise DC bias pads, as mentioned herein. The DC bias pads can be integrated into the antenna wafer and used for active device measurements. FIG. 12 are several non-limiting examples of antennas that can be used in embodiments of the antenna-coupled radio frequency (RF) probe with a replaceable tip described herein.

Figure 13:
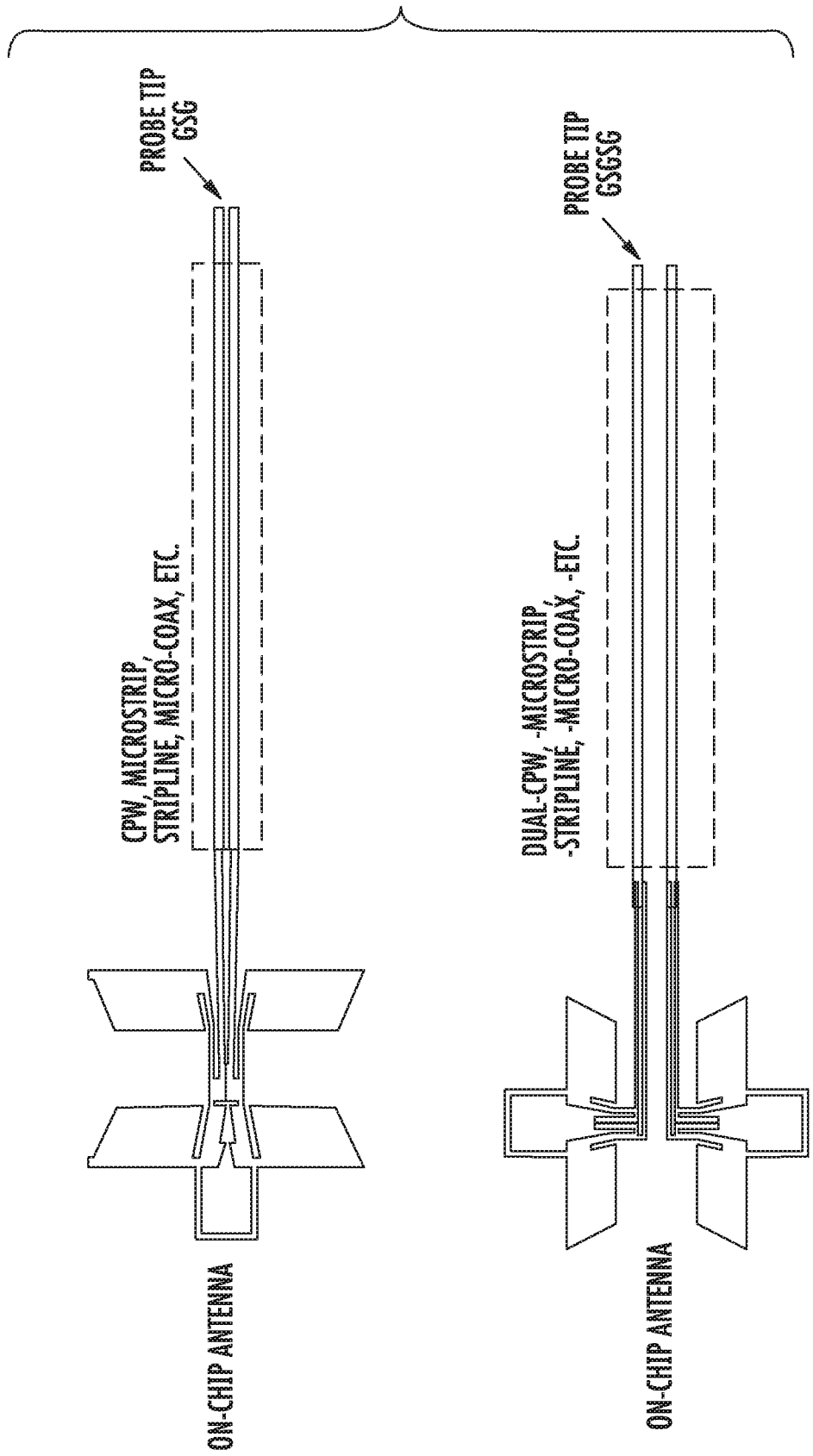
FIG. 13 illustrates examples of transmission lines that can be used to transmit signal from the probe tip to the antenna placed on the probe beam spot.
Figure 14:
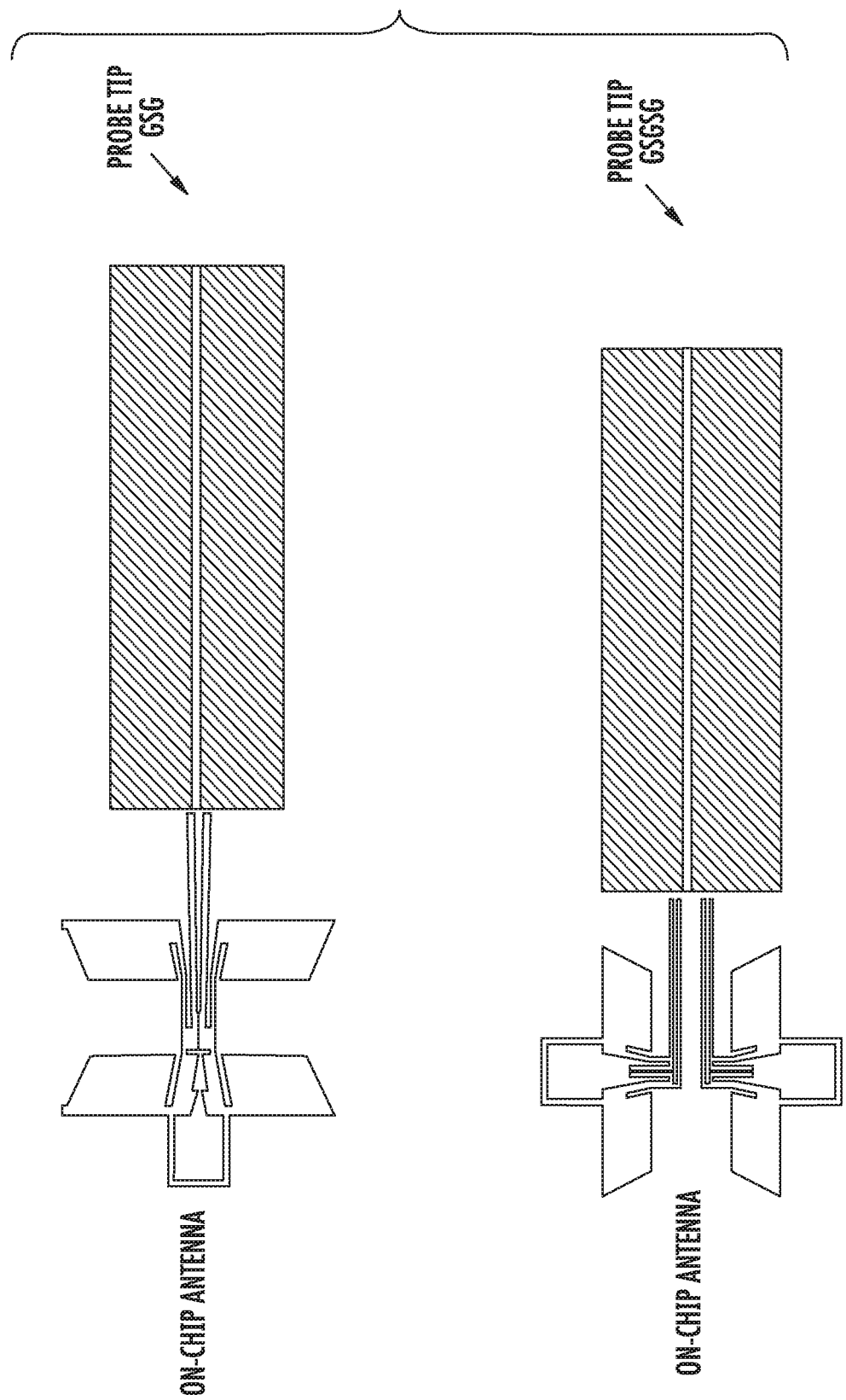
FIG. 14 illustrates that the transmission lines may comprise low-loss, broadband, photonic crystal waveguides, which may be used for both single-mode and differential-mode probe tips.
Figure 15:
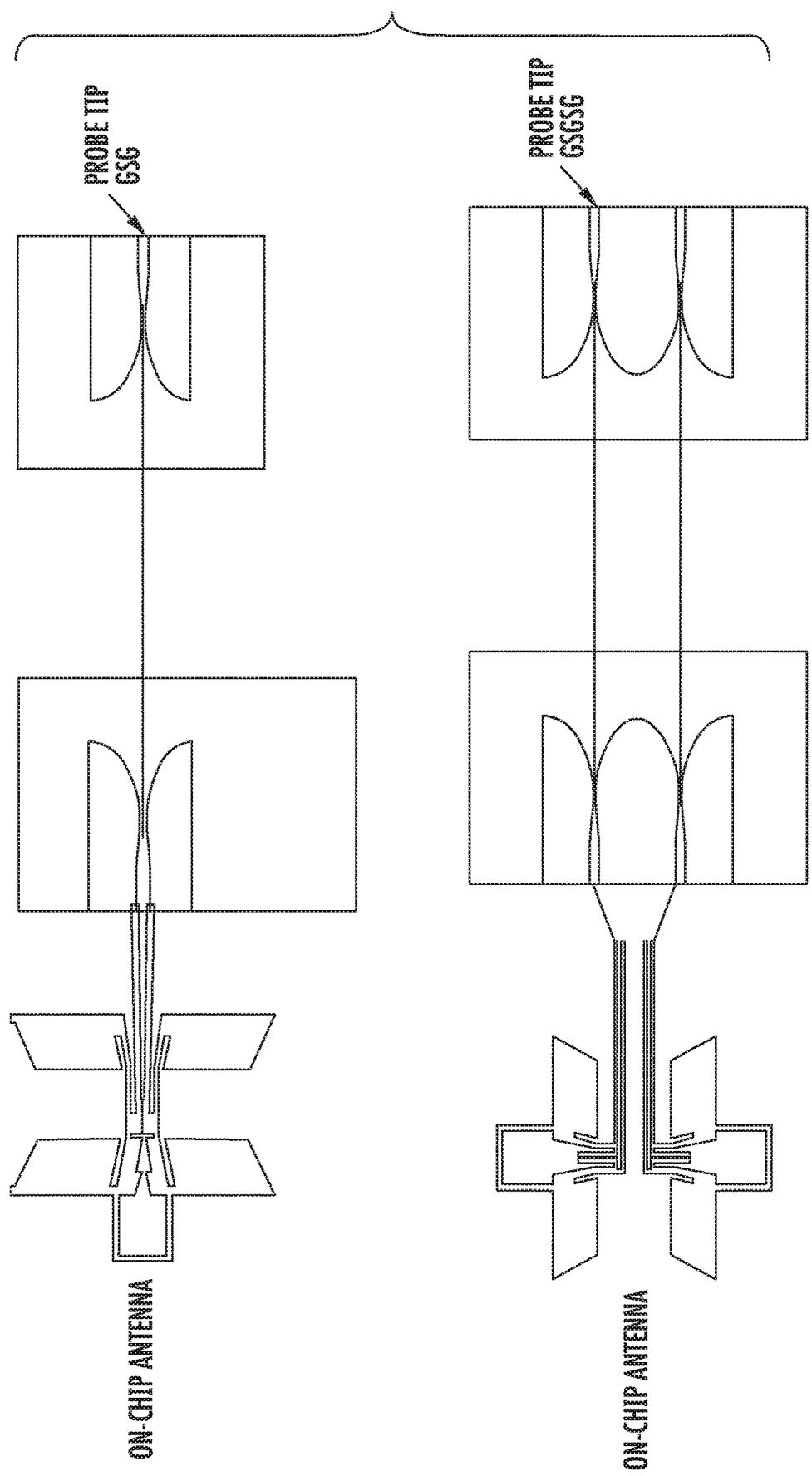
FIG. 15 illustrates that in some instances the transmission lines may comprise low-loss, broadband, dispersion-free Goubau lines, which may be used for both single-mode and differential-mode probe tips.
Figure 16:
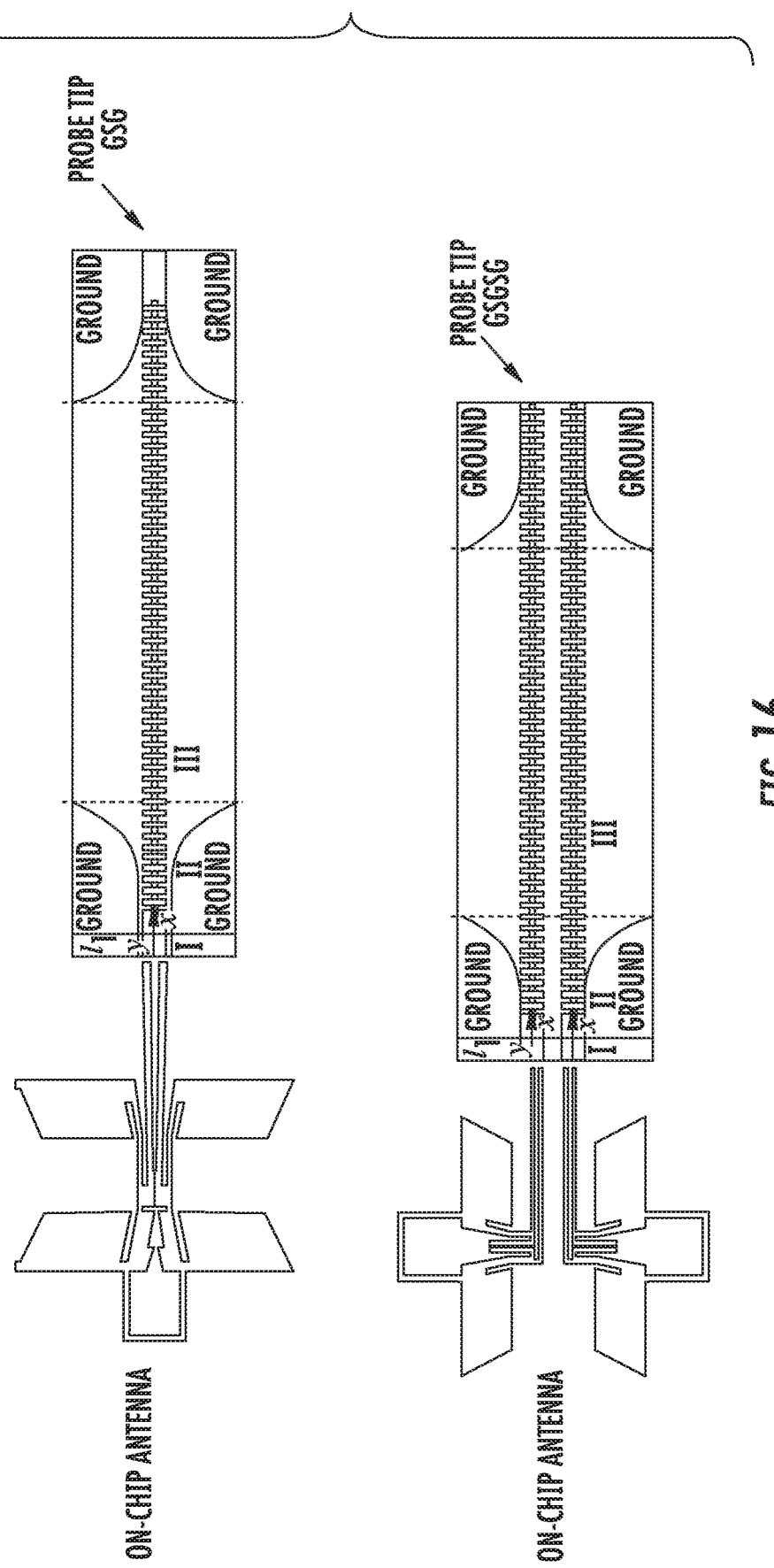
FIG. 16 illustrates that in some instances the transmission lines may comprise low-loss, planar corrugated lines, which may be used for both single-mode and differential-mode probe tips.
Figure 17:
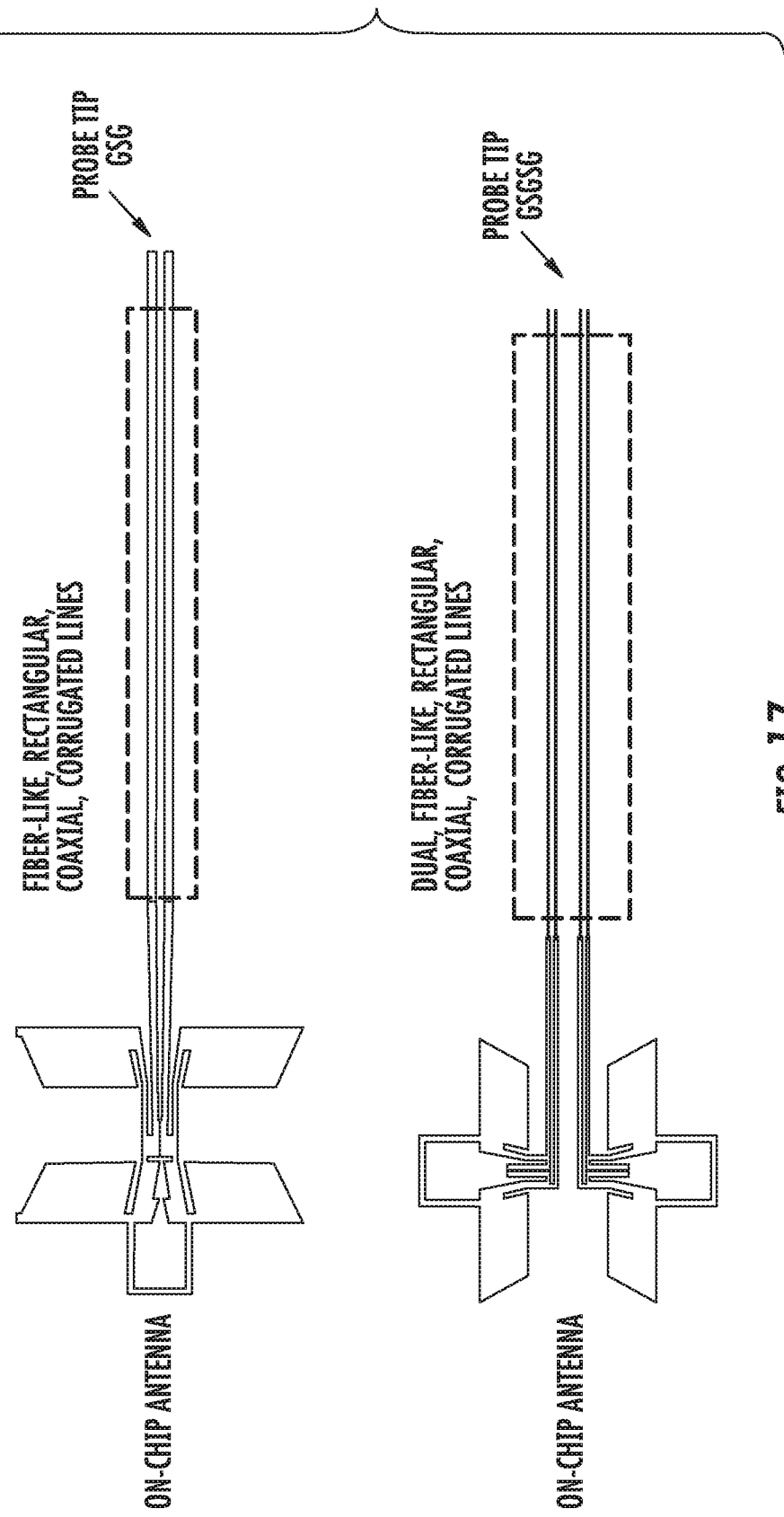
FIG. 17 illustrates that in some instances the transmission lines may comprise low-loss, three-dimensional (3D) transmission lines such as fiber-like, rectangular, coaxial, corrugated lines, which may be used for both single-mode and differential-mode probe tips.

FIG. 13 illustrates examples of transmission lines that can be used to transmit signal from the probe tip to the antenna. The top illustration of FIG. 13 is for single-mode probe tips and the bottom illustration is for differential-mode probe tips. As indicated, the single-mode transmission lines include coplanar waveguide (CPW), microstrip, stripline, micro-coax, and the like, and the differential-mode transmission lines include dual-CPW, dual-microstrip, dual stripline, dual-micro-coax, and the like. In some instances, as shown in FIG. 14, the transmission lines may comprise low-loss, broadband, photonic crystal waveguides, which may be used for both single-mode and differential-mode probe tips. In some instances, as shown in FIG. 15, the transmission lines may comprise low-loss, broadband, dispersion-free Goubau lines, which may be used for both single-mode and differential-mode probe tips. In some instances, as shown in FIG. 16, the transmission lines may comprise low-loss, planar corrugated lines, which may be used for both single-mode and differential-mode probe tips. In some instances, as shown in FIG. 17, the transmission lines may comprise low-loss, three-dimensional (3D) transmission lines such as fiber-like, rectangular, coaxial, corrugated lines, which may be used for both single-mode and differential-mode probe tips.

Figure 18:
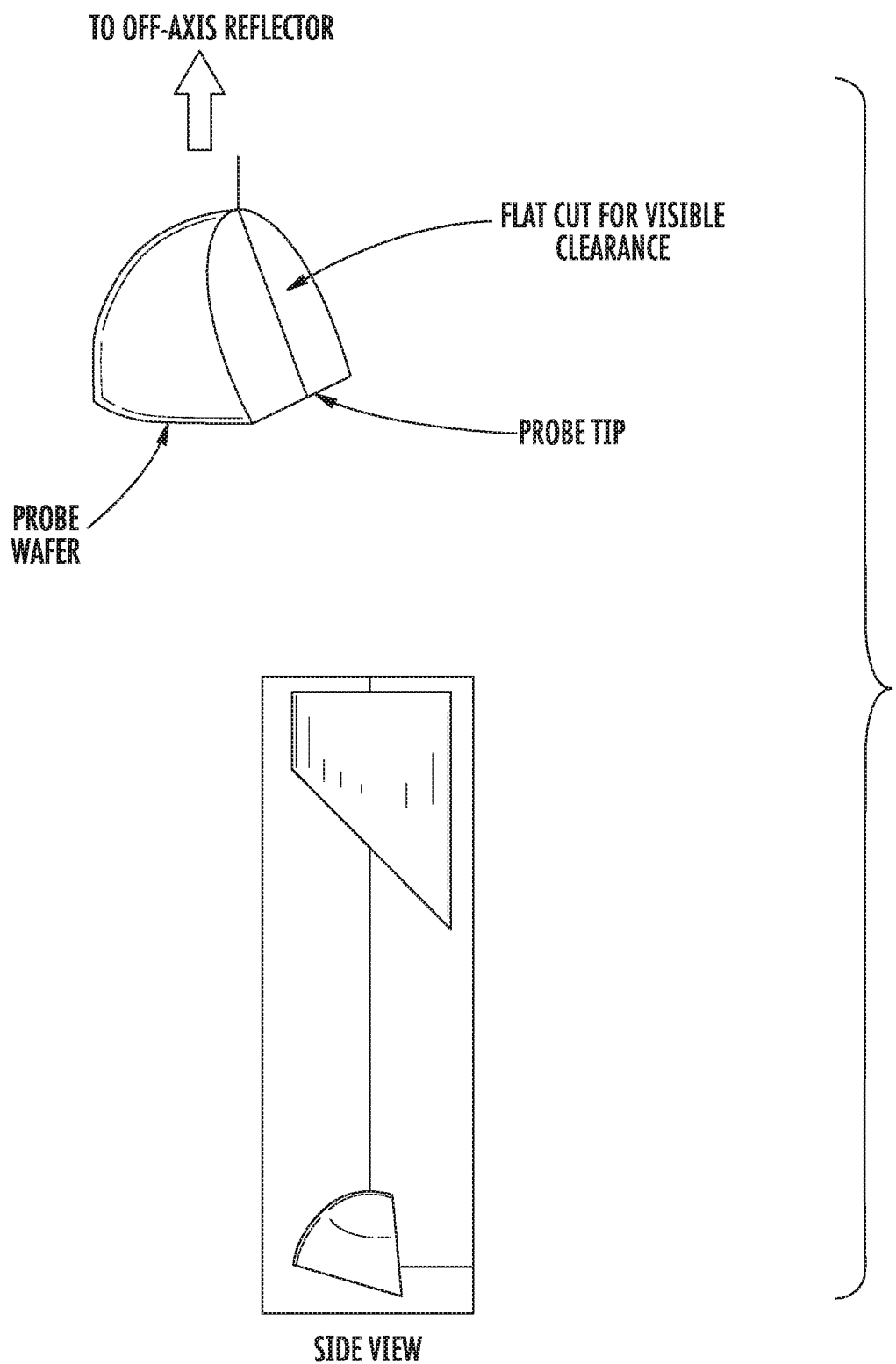
FIG. 18 illustrates an embodiment of a probe lens comprising a lens that is shaped to minimize the distance between the probe antenna and the probe tip.

FIG. 18 illustrates an embodiment of a probe lens comprising a lens shape that minimizes the distance between the probe tip and the probe antenna. One side of the lens can be cut out with minimal impact on numerical aperture to allow for access to probe tips close to the lens' optical axis, where the probe antenna is placed. This wedge-shaped lens geometry thus minimized the associated probe tip loss by minimizing the distance between the probe tip and the probe antenna.

Figure 19A:
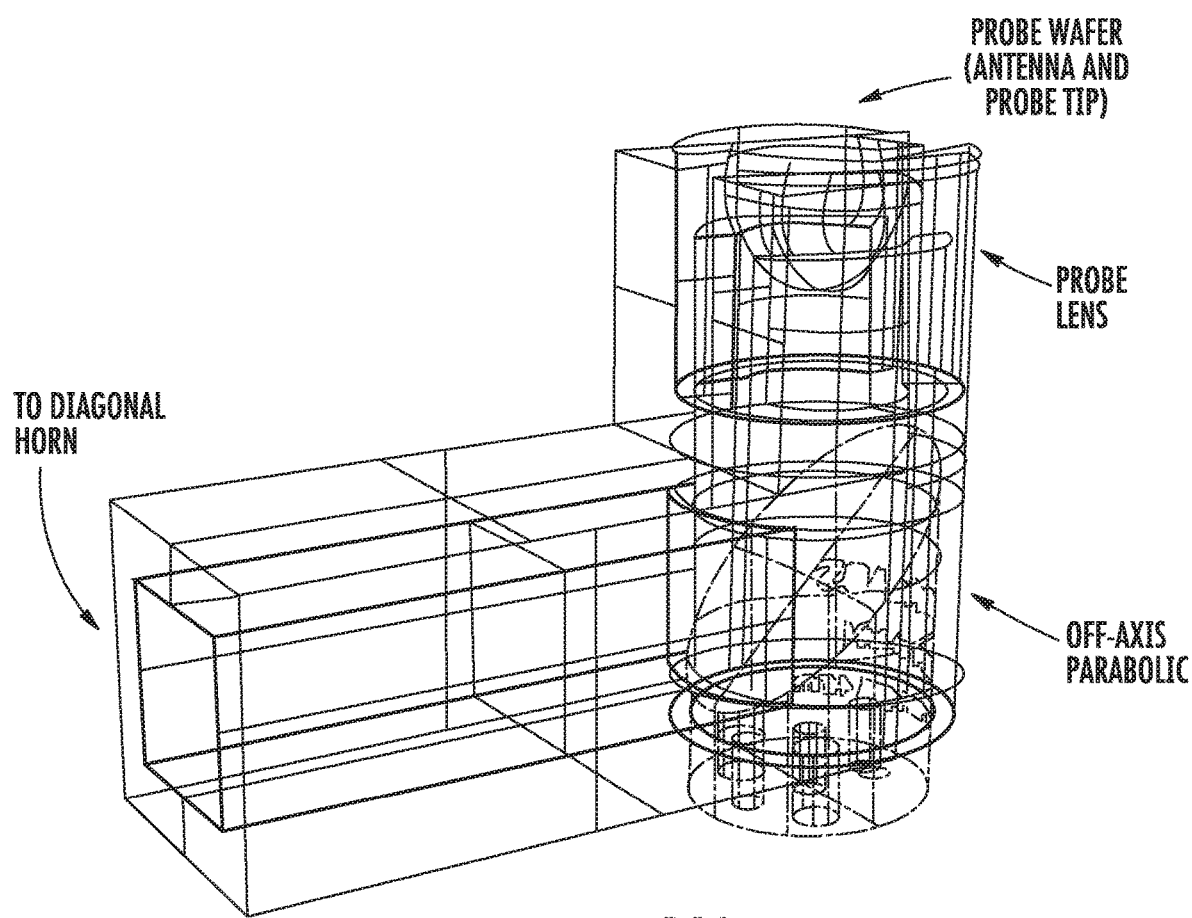
FIGS. 19A-19C are exemplary prototyping models of an antenna-coupled radio frequency (RF) probe with a replaceable tip, according to the embodiments described herein.
Figure 19B:
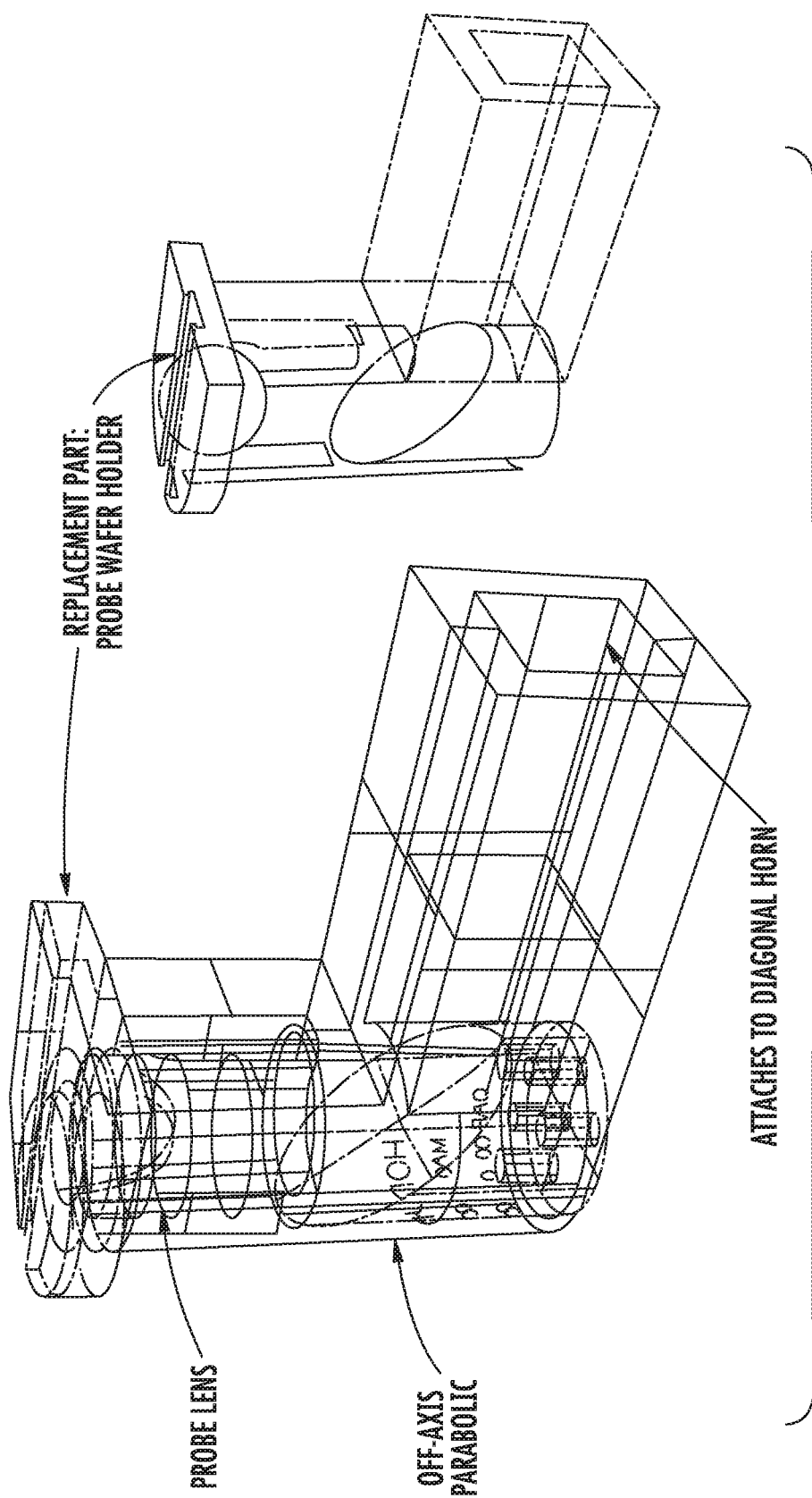
Figure 19C:
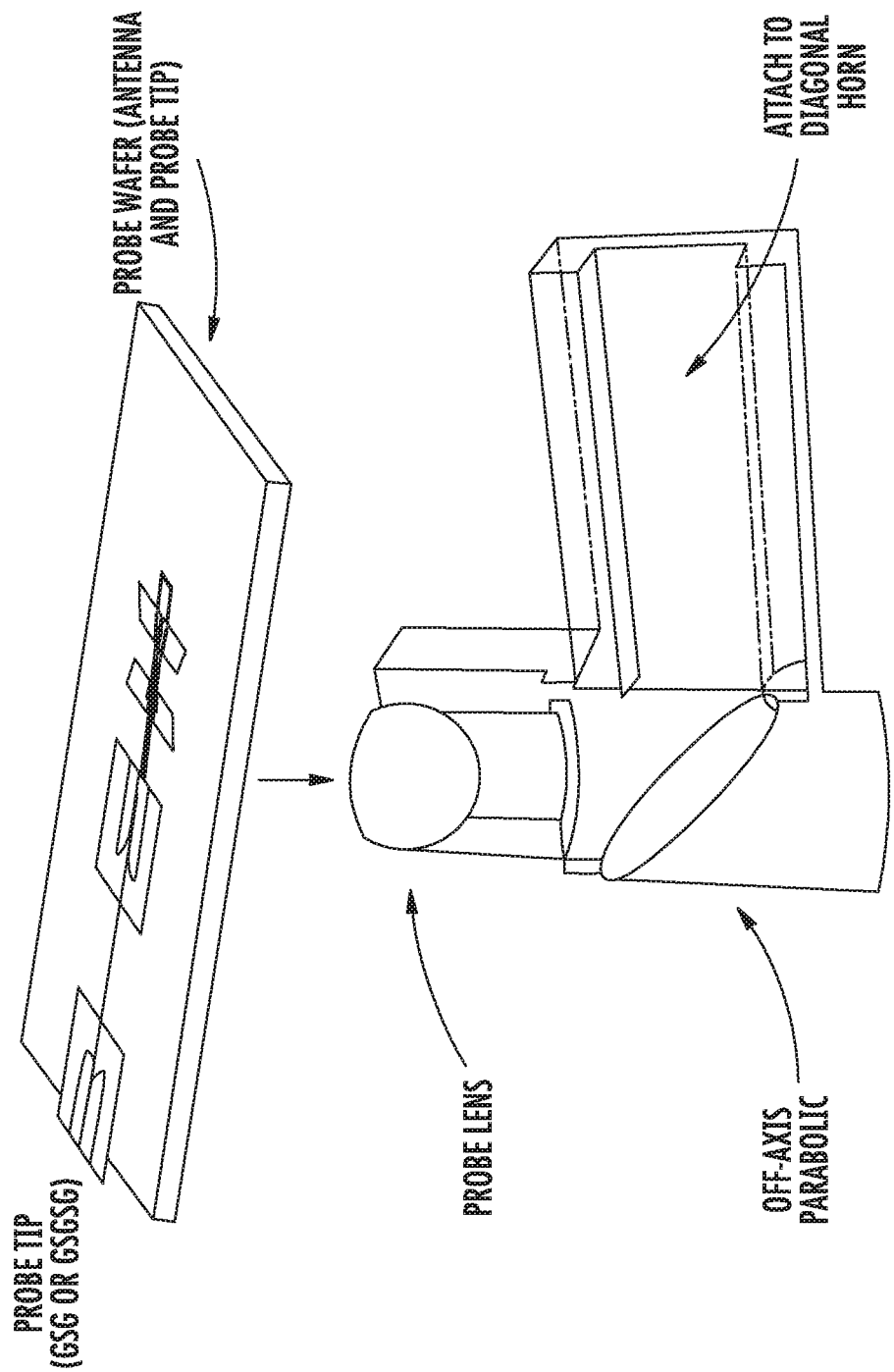

FIGS. 19A-19C are exemplary prototyping models of an antenna-coupled radio frequency (RF) probe with a replaceable tip, according to the embodiments described herein.

Figure 20:
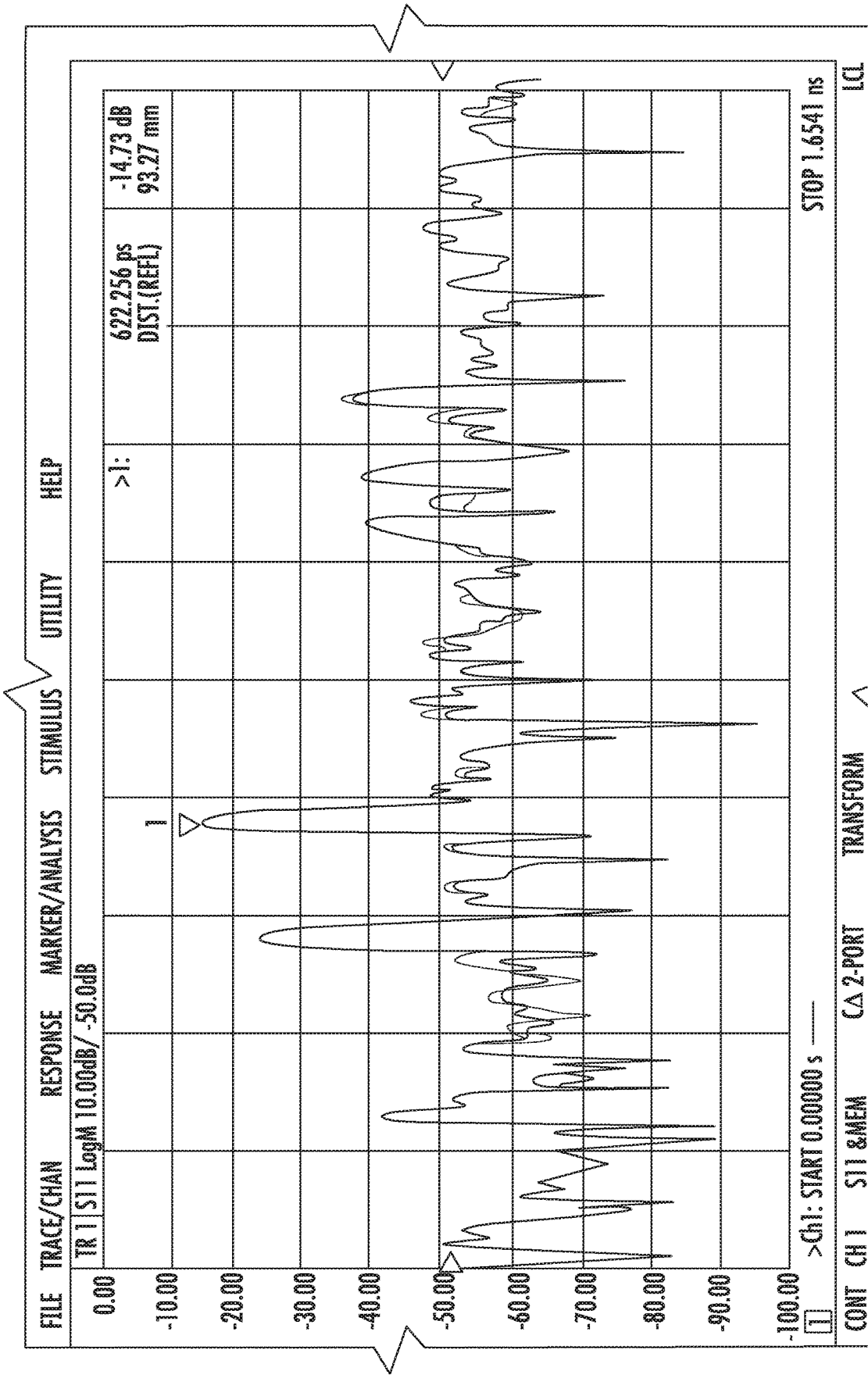
FIG. 20 is a photograph showing a trace that records the repeatability of two different probes according to the embodiments described herein.

FIG. 20 is a photograph showing a trace that records the repeatability of two different probes according to the embodiments described herein.

Figure 21:
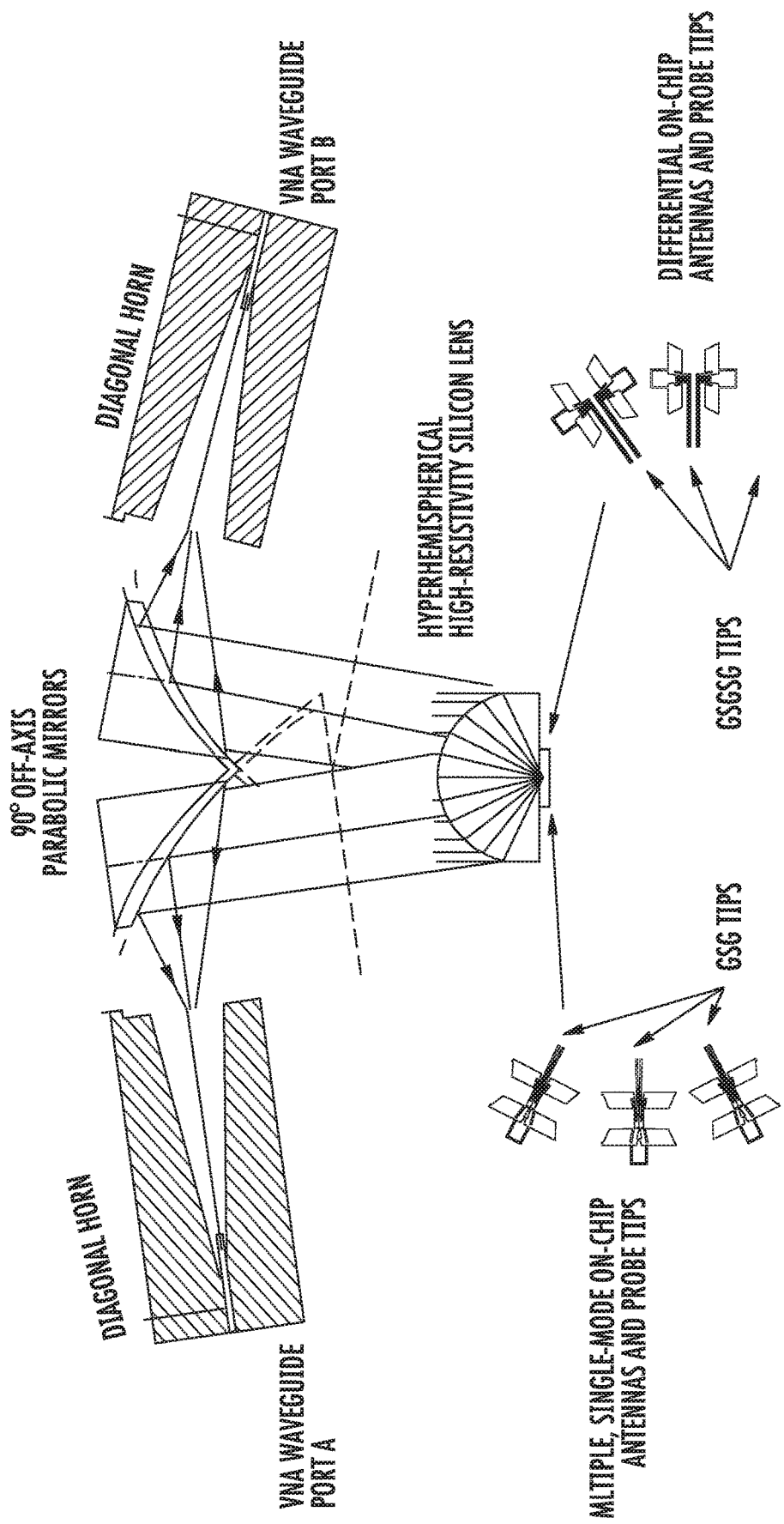
FIG. 21 illustrates an alternate embodiment of antenna-coupled radio frequency (RF) probes with multiple probe antennas on the replaceable tip, which enables multi-port operation.
Figure 22:
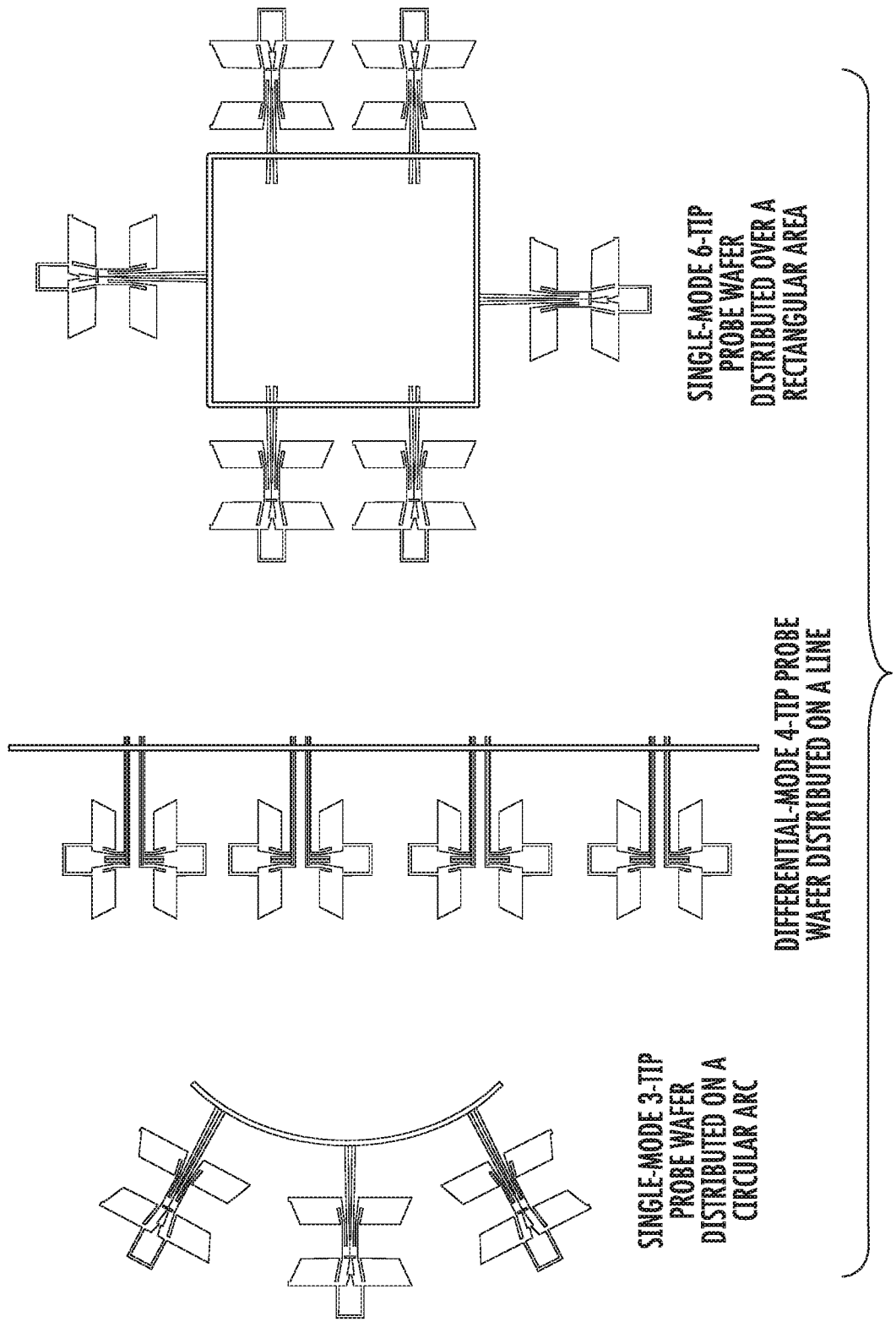
FIG. 22 illustrates non-limiting examples of multi-port probe tips and corresponding antennas as they could be arranged for testing a DUT.

FIGS. 21 and 22 illustrate alternate embodiments of antenna-coupled radio frequency (RF) probes with a replaceable tip. As shown in FIG. 21, multiple probes on the tip are fed by multiple horn antennas, 90 degree off-axis collimating reflectors, and lenses. For example, as shown in FIG. 21, the antenna wafer comprises a plurality of ports focusing onto an equal plurality of antennas on the same probe tip and providing a plurality of test ports for the DUT. FIG. 22 illustrates non-limiting examples of probe tips and corresponding antenna as they could be arranged for testing a DUT.

CONCLUSION

While the methods and systems have been described in connection with preferred embodiments and specific examples, it is not intended that the scope be limited to the particular embodiments set forth, as the embodiments herein are intended in all respects to be illustrative rather than restrictive.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

Throughout this application, various publications are referenced. The disclosures of these publications in their entireties are hereby incorporated by reference into this application in order to more fully describe the state of the art to which the methods and systems pertain.

It will be apparent to those skilled in the art that various modifications and variations can be made without departing from the scope or spirit. Other embodiments will be apparent to those skilled in the art from consideration of the specification and practice disclosed herein. It is intended that the specification and examples be considered as exemplary only, with a true scope and spirit being indicated by the following claims.

What is claimed is:

1. An antenna-coupled radio frequency (RF) probe with a replaceable tip comprising:
   a probe tip;
   one or more transmission lines connected to the probe tip;
   one or more antenna connected to the one or more transmission lines; and
   a probe body, wherein the probe body comprises at least a focusing device, wherein the focusing device focuses signals received by the focusing device such that they are routed to a desired location,
   wherein at least one of the one or more antenna comprise one or more direct-current (DC) bias pads, wherein the DC bias pads of the one or more antenna allow for direct current injection bias to be applied to a device under test.

2. The RF probe of claim 1, wherein the probe tip comprises a single-mode probe tip or a differential-mode probe tip.

3. The RF probe of claim 2, wherein the single-mode probe tip comprises a ground-signal (GS) or a ground-signal-ground (GSG) probe tip and the differential-mode probe tip comprises a ground-signal-ground-signal-ground (GSGSG) probe tip.

4. The RF probe of claim 1, wherein the probe body further comprises one or more collimating structures, wherein the one or more collimating structures are used to route the signals to the desired location.

5. The RF probe of claim 4, wherein the one or more collimating structures comprise at least one 90° off-axis parabolic mirror.

6. The RF probe of claim 1, wherein the desired location comprises a horn antenna, a directive aperture, a dielectric rod or a travelling-wave antenna.

7. The RF probe of claim 1, further comprising an antenna wafer, wherein the probe tip, the one or more transmission lines connected to the probe tip, and the one or more antennas connected to the one or more transmission lines are located on the antenna wafer.

8. The RF probe of claim 7, wherein the antenna wafer is separate from the probe body such that the probe tip can be replaced without replacing the probe body.

9. The RF probe of claim 1, wherein the focusing device comprises one of a hyperhemispherical high-resistivity silicon lens, a convex lens, a Fresnel zone plat or flat lens, a photonic crystal, a horn antenna, and a micro-lens array.

10. The RF probe of claim 1, wherein the one or more antenna comprise an antenna array.

11. The RF probe of claim 1, wherein the one or more antenna comprise one or more beam-corrected antenna.

12. The RF probe of claim 1, wherein the DC current injection can be transferred from the probe body to the probe tip via clamping and/or pin connection.

13. The RF probe of claim 1, wherein the one or more antenna comprise one or more of bowtie, self-complementary, square spiral, loop, dual-slot, spiral, dual-folded, sinuous, patch, equiangular spiral, traveling-wave, dielectric resonator or photonic bandgap antenna.

14. The RF probe of claim 1, wherein the one or more transmission lines connected to the probe tip comprise one or more of coplanar waveguides, striplines, microstrips, micro-coaxes, photonic crystal waveguides, Goubau lines, planar corrugated lines, and three-dimensional transmission lines.

15. An antenna-coupled radio frequency (RF) probe with a replaceable tip comprising:
 a probe tip;
 one or more transmission lines connected to the probe tip;
 one or more antenna connected to the one or more transmission lines; and
 a collimating structure, wherein the collimating structure routes signals from the one or more antenna to a desired location,
 wherein at least one of the one or more antenna comprise one or more direct-current (DC) bias pads, wherein the DC bias pads of the one or more antenna allow for direct current injection bias to be applied to a device under test.

16. The RF probe of claim 15, wherein the probe tip comprises a single-mode probe tip or a differential-mode probe tip.

17. The RF probe of claim 16, wherein the single-mode probe tip comprises a ground-signal (GS) or a ground-signal-ground (GSG) probe tip and the differential-mode probe tip comprises a ground-signal-ground-signal-ground (GSGSG) probe tip.

18. The RF probe of claim 15, wherein the collimating structure comprises one or more mirrors, wherein the one or more mirrors are used to route the signals to the desired location.

19. The RF probe of claim 18, wherein the one or more mirrors comprise at least one 90° off-axis parabolic mirror.

20. The RF probe of claim 18, wherein the desired location comprises a horn antenna, a directive aperture, a dielectric rod or a travelling-wave antenna.

21. The RF probe of claim 15, further comprising an antenna wafer, wherein the probe tip, the one or more transmission lines connected to the probe tip, and the one or more antennas connected to the one or more transmission lines are located on the antenna wafer.

22. The RF probe of claim 21, wherein the collimating structure comprises a probe body and the antenna wafer is separate from the probe body such that the probe tip can be replaced without replacing the probe body.

23. The RF probe of claim 15, wherein the DC current injection can be transferred from the probe body to the probe tip via clamping and/or pin connection.

24. The RF probe of claim 15, wherein the one or more antenna comprise one or more leaky-wave antenna.

25. The RF probe of claim 15, wherein the one or more antenna comprise an antenna array.

26. The RF probe of claim 15, wherein the one or more transmission lines connected to the probe tip comprise one or more of coplanar waveguides, striplines, microstrips, micro-coaxes, photonic crystal waveguides, Goubau lines, planar corrugated lines, and three-dimensional transmission lines.

27. An antenna-coupled radio frequency (RF) probe with a replaceable tip comprising:
 a plurality of probe tips;
 one or more transmission lines connected to each of the plurality of probe tips;
 a plurality of antenna connected to the one or more transmission lines such that each one of the plurality of probe tips are associated with at least one of the plurality of antenna; and
 a probe body, wherein the probe body comprises at least one focusing device, wherein each of the at least one focusing device focuses signals received by the at least one focusing device such that they are routed through each of the at least one waveguides to one or more desired locations,
 wherein at least one of the plurality of antenna comprise a direct-current (DC) bias pad, wherein the DC bias pad allows for direct current injection bias to be applied to a device under test.

28. The RF probe of claim 27, wherein the probe body comprises two or more waveguides and two or more corresponding collimating structures such that the signals are routed to two or more horn antennas, a directive aperture, a dielectric rod or a travelling-wave antenna.

29. The RF probe of claim 28, wherein the two or more collimating structures each comprise 90° off-axis parabolic mirrors.

* * * * *